United States Patent
Jang

(10) Patent No.: US 9,886,381 B2
(45) Date of Patent: Feb. 6, 2018

(54) MEMORY SYSTEM AND OPERATING METHOD THEREOF

(71) Applicant: SK hynix Inc., Gyeonggi-do (KR)

(72) Inventor: Eun-Soo Jang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 41 days.

(21) Appl. No.: 15/140,302

(22) Filed: Apr. 27, 2016

(65) Prior Publication Data

US 2017/0147489 A1    May 25, 2017

(30) Foreign Application Priority Data

Nov. 23, 2015    (KR) ........................ 10-2015-0163874

(51) Int. Cl.
| | |
|---|---|
| *G06F 12/02* | (2006.01) |
| *G06F 12/0802* | (2016.01) |
| *G11C 16/10* | (2006.01) |
| *G11C 7/10* | (2006.01) |
| *G11C 16/04* | (2006.01) |

(52) U.S. Cl.
CPC ...... *G06F 12/0802* (2013.01); *G06F 12/0246* (2013.01); *G11C 7/1042* (2013.01); *G11C 16/10* (2013.01); *G06F 12/0253* (2013.01); *G06F 2212/604* (2013.01); *G11C 16/0483* (2013.01)

(58) Field of Classification Search
None
See application file for complete search history.

(56) References Cited

U.S. PATENT DOCUMENTS

| | | | |
|---|---|---|---|
| 2008/0195804 A1 | 8/2008 | Kim et al. | |
| 2008/0250195 A1* | 10/2008 | Chow | G06F 12/0246 711/103 |
| 2009/0006725 A1 | 1/2009 | Ito et al. | |
| 2010/0125695 A1* | 5/2010 | Wu | G06F 3/0613 711/103 |
| 2011/0252187 A1* | 10/2011 | Segal | G06F 12/0246 711/103 |
| 2012/0239853 A1* | 9/2012 | Moshayedi | G06F 11/1441 711/103 |

(Continued)

FOREIGN PATENT DOCUMENTS

| | | |
|---|---|---|
| KR | 1020080075751 | 8/2008 |
| KR | 1020140040137 | 4/2014 |

*Primary Examiner* — Kaushikkumar Patel
(74) *Attorney, Agent, or Firm* — IP & T Group LLP

(57) ABSTRACT

A memory system may include: a first memory device including a first normal block and a first auxiliary block; a second memory device including a second normal block and a second auxiliary block; and a controller configured to operate the first and second memory devices in an interleaving scheme, wherein the controller: checks a first used area of a cache buffer when a first data is buffered which is the most recently inputted, programs the first data in the first or second auxiliary block without erasing the first data from the cache buffer, when the first used area of the cache buffer is smaller than a predetermined size, and programs a second data of the predetermined size, which occupies a part of the first used area of the cache buffer, to the first or second normal block with erasing the second data from the cache buffer, when the first used area of the cache buffer is equal to or larger than the predetermined size.

18 Claims, 22 Drawing Sheets

(56) References Cited

U.S. PATENT DOCUMENTS

| | | | |
|---|---|---|---|
| 2012/0278541 A1* | 11/2012 | Yamaki | G06F 12/0246 |
| | | | 711/103 |
| 2013/0279249 A1* | 10/2013 | Yun | G11C 16/10 |
| | | | 365/185.03 |
| 2014/0133220 A1* | 5/2014 | Danilak | G06F 12/0246 |
| | | | 365/158 |
| 2014/0250258 A1* | 9/2014 | Cheng | G06F 12/0246 |
| | | | 711/103 |
| 2014/0281132 A1* | 9/2014 | Bundukin | G06F 12/0246 |
| | | | 711/103 |

\* cited by examiner

MEMORY SYSTEM AND OPERATING METHOD THEREOF

CROSS-REFERENCE TO RELATED APPLICATION

This application claims priority under 35 U.S.C. § 119 to Korean Patent Application No. 10-2015-0163874 filed on Nov. 23, 2015, the disclosure of which is herein incorporated by reference in its entirety.

TECHNICAL FIELD

Exemplary embodiments relate to a semiconductor design technology, and more particularly, to a memory system supporting a one-shot program operation and an operating method thereof.

DISCUSSION OF THE RELATED ART

The computer environment paradigm has shifted to ubiquitous computing systems that can be used anywhere and at any time, resulting in a rapidly increasing use of portable electronic devices such as mobile phones, digital cameras, and notebook computers. These portable electronic devices may use a memory system having a memory device for storing data, that is, a data storage device. A data storage device may be used as a main or an auxiliary memory device of a portable electronic device.

Data storage devices using semiconductor memory devices provide excellent stability, durability, a high information access speed, and low power consumption. Examples of data storage devices having such advantages include universal serial bus (USB) memory devices, memory cards having various interfaces, and solid state drives (SSD).

SUMMARY

Various embodiments are directed to a memory system capable of supporting an effective one-shot program operation even in the case where data smaller than a predetermined size is inputted, and an operating method thereof.

In an embodiment, a memory system may include: a first memory device including a first normal block and a first auxiliary block; a second memory device including a second normal block and a second auxiliary block; and a controller configured to operate the first and second memory devices in an interleaving scheme, wherein the controller: checks a first used area of a cache buffer when a first data is buffered which is the most recently inputted, programs the first data in the first or second auxiliary block without erasing the first data from the cache buffer, when the first used area of the cache buffer is smaller than a predetermined size, and programs a second data of the predetermined size, which occupies a part of the first used area of the cache buffer, to the first or second normal block with erasing the second data from the cache buffer, when the first used area of the cache buffer is equal to or larger than the predetermined size.

In case of the first data is inputted when a third data which is inputted prior to the first data remains in the cache buffer, the controller may further buffer the first data in the cache buffer together with the third data.

The controller may store mapping information on a physical address and a logical address of the first data and a physical address of the second data in an address management region, and may do not store a logical address of the second data in the address management region.

The controller may program a physical address designating a location from which an empty space of the first auxiliary block starts, in the address management region, as a first storage location information, and may program a physical address designating a location from which an empty space of the second auxiliary block starts, in the address management region, as a second storage location information.

The controller may program the first data in the first auxiliary block or the second data in the first normal block when the first memory device operates in the interleaving scheme, and may program the first data in the second auxiliary block or the second data in the second normal block when the second memory device operates in the interleaving scheme.

The controller may program the second data with the second storage location information in the first normal block when the first memory device operates in the Interleaving scheme, and may program the second data with the first storage location information in the second normal block when the second memory device operates in the interleaving scheme.

In case where the first data is programmed in the first auxiliary block when the first memory device operates in the interleaving scheme, the controller may program the first data in the empty space of the first auxiliary block using the first storage location information and then updates the first storage location information, and in case where the first data is programmed in the second auxiliary block when the second memory device operates in the Interleaving scheme, the controller may program the first data in the empty space of the second auxiliary block using the second storage location information and then updates the second storage location information.

When a size of the first data and the third data is equal to or larger than the predetermined size, the controller may program the first data and the third data as the second data in the first or second normal block.

The controller may manage the first data as a valid state in the first or the second auxiliary block when the first data is stored both in any of the first and the second auxiliary blocks and in the cache buffer, and may manage the first data as an invalid state in the first or the second auxiliary block when the first data is stored both in any of the first and the second auxiliary blocks and in any of the first and the second normal blocks.

During a booting operation period, the controller may buffer the first data of the valid state stored in the first and the second auxiliary block, in the cache buffer, may read the second storage location information stored in the first normal block and the first storage location information stored in the second normal block, and may store the first and the second storage location information in the address management region.

The controller may check a second used area of the first or second auxiliary block using the first or second storage location information, and may erase the first or second auxiliary block, when the second used area exceeds a predetermined usable size.

The controller may perform a background operation, the background operation may include a garbage collection operation, a wear leveling operation and a read reclaim operation, for only the first and second normal blocks, and the controller may do not perform the background operation for the first and second auxiliary blocks.

In an embodiment, a method for operating a memory system having a first memory device and a second memory device, the first memory device including a first normal block and a first auxiliary block, the second memory device including a second normal block and a second auxiliary block, the method may include: operating the first memory device and the second memory device in an Interleaving scheme; checking a first used area of a cache buffer when buffering of a first data which is the most recently inputted; programming the first data in the first or second auxiliary block without erasing the first data from the cache buffer, when the first used area of the cache buffer is smaller than a predetermined size; and programming a second data of the predetermined size, which occupies a part of the first used area of the cache buffer, to the first or second normal block with erasing the second data from the cache buffer, when the first used area of the cache buffer is equal to or larger than the predetermined size.

In case of the first data is inputted when a third data which is inputted prior to the first data remains in the cache buffer, the buffering of the first data may include buffering the third data together with the first data in the cache buffer.

The method may further include: storing mapping information on a physical address and a logical address of the first data and a physical address of the second data in an address management region; and not storing a logical address of the second data in the address management region.

The method may further include: storing a physical address designating a location from which an empty space of the first auxiliary block starts, in the address management region, as a first storage location information; and storing a physical address designating a location from which an empty space of the second auxiliary block starts, in the address management region, as a second storage location information.

The erasing the second data from the cache buffer, when the first used area of the cache buffer is equal to or larger than the predetermined size may include: selecting the first memory device or the second memory device according to the interleaving scheme; when the first memory device is selected, programming the second data with the second storage location information in the first normal block and erasing the second data from the cache buffer; and when the second memory device is selected, programming the second data with the first storage location information in the second normal block and erasing the second data from the cache buffer.

The without erasing the first data from the cache buffer, when the first used area of the cache buffer is smaller than a predetermined size may include: selecting the first memory device or the second memory device according to the interleaving scheme; when the first memory device is selected, programming the first data in the empty space of the first auxiliary block using the first storage location information, updating the first storage location information, and without erasing the first data from the cache buffer; and when the second memory device is selected, programming the first data in the empty space of the second auxiliary block using the second storage location information, updating the second storage location information, and without erasing the first data from the cache buffer.

When a size of the first data and the third data is equal to or larger than the predetermined size, the programming of the second data of the predetermined size may include programming the first data and the third data as the second data in the first or second normal block.

The method may further include: managing the first data as a valid state in the first or the second auxiliary block, when the first data which is stored both in any of the first and the second auxiliary blocks and in the cache buffer; and managing the first data as an invalid state in the first or the second auxiliary block, when the first data is stored both in any of the first and the second auxiliary blocks and in any of the first and the second normal blocks.

The method may further include: during a booting operation period, buffering the first data of the valid state stored in the first and the second auxiliary block, in the cache buffer; during the booting operation period, reading the second storage location information stored in the first normal block and the first storage location information stored in the second normal block; and during the booting operation period, storing the first and the second storage location information in the address management region.

The method may further include: checking a second used area of the first or second auxiliary block using the first or second storage location information; erasing the first or second auxiliary block, when the second used area exceeds a predetermined usable size; performing a background operation for only the first and the second normal blocks, and not performing the background operation for the first and second auxiliary blocks, the background operation may include a garbage collection operation, a wear leveling operation, and a read reclaim operation.

DETAILED DESCRIPTION

Figure 1:
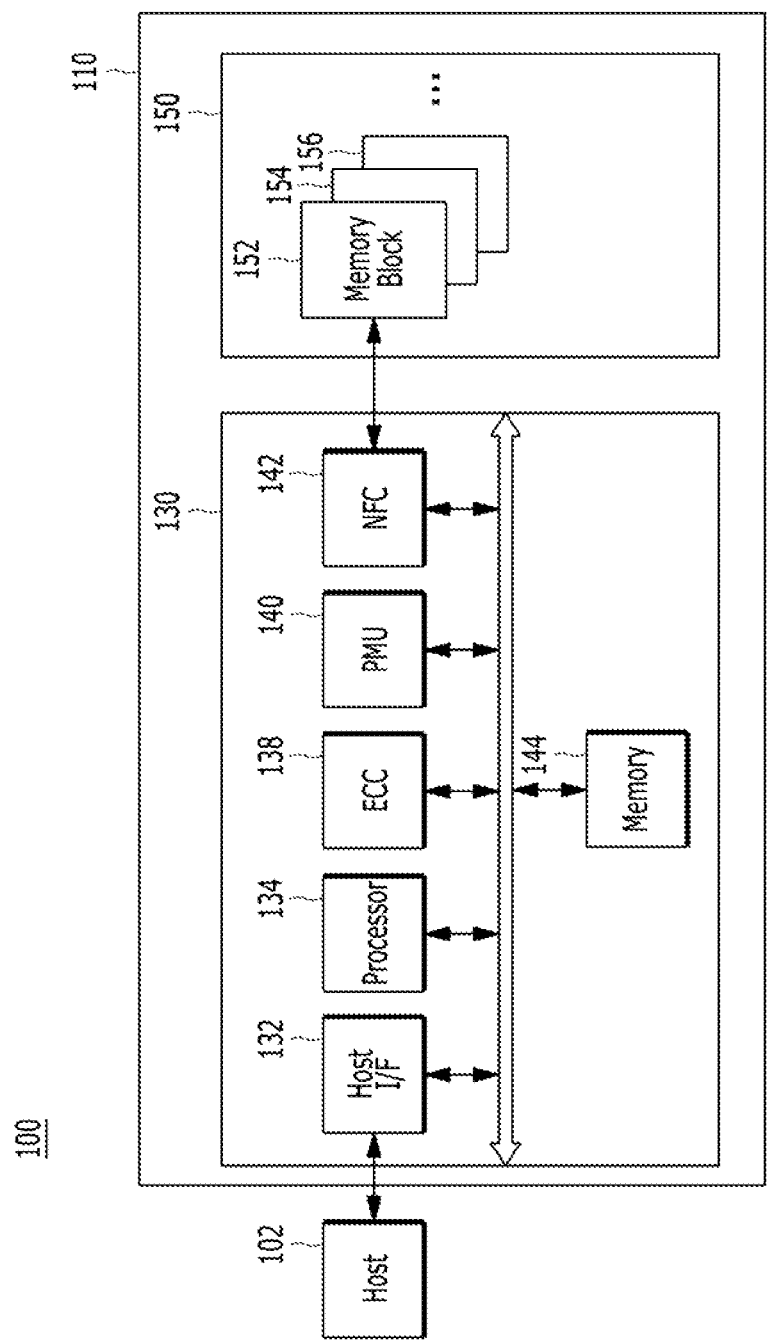
FIG. 1 is a diagram illustrating a data processing system including a memory system in an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Referring to FIG. 1, a data processing system 100 is provided, according to an embodiment of the invention. The data processing system 100 may include a host 102 and a memory system 110.

The host 102 may include any suitable electronic device. For example, the host 102 may include a portable electronic device such as a mobile phone, an MP3 player, a laptop computer and the like. The host may include a non-portable electronic device such as a desktop computer, a game player, a TV, a projector and the like.

The memory system 110 may operate in response to a request from the host 102. For example, the memory system may store data to be accessed by the host 102. The memory system 110 may be used as a main memory system or an auxiliary memory system of the host 102. The memory system 110 may be implemented with any suitable storage device, according to the protocol of a host interface electrically coupled with the host 102. One or more semiconductor memory devices may be used. Volatile or non-volatile memory devices may be used. For example, the memory system 110 may be implemented with a solid state drive (SSD), a multimedia card (MMC), an embedded MMC (eMMC), a reduced size MMC (RS-MMC) and a micro-MMC, a secure digital (SD) card, a mini-SD and a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device, such as a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase change RAM (PRAM), a magneto-resistive RAM (MRAM), a resistive RAM (RRAM) and the like.

The memory system 110 may include a memory device 150 which stores data to be accessed by the host 102, and a controller 130 which may control storage of data in the memory device 150.

The controller 130 and the memory device 150 may be integrated into a single semiconductor device. For instance, the controller 130 and the memory device 150 may be integrated into one semiconductor device configured as a solid state drive (SSD). Configuring the memory system 110 as an SSD, may generally allow a significant increase in the operation speed of the host 102.

The controller 130 and the memory device 150 may be integrated into a single semiconductor device configured as a memory card, such as a Personal Computer Memory Card International Association (PCMCIA) card, a compact flash (CF) card, a smart media (SM) card (SMC), a memory stick, a multimedia card (MMC), an RS-MMC and a micro-MMC, a secure digital (SD) card, a mini-SD, a micro-SD and an SDHC, a universal flash storage (UFS) device and the like.

Also, for example, the memory system 110 may be or configure a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device may store data provided from the host 102 during a write operation, and provide the stored data to the host 102 during a read operation. The memory device 150 may include one or more memory blocks 152, 154 and 156. Each of the memory blocks 152, 154 and 156 may include a plurality of pages. Each of the pages may include a plurality of memory cells to which a plurality of word lines (WL) may be electrically coupled. The memory device 150 may be a nonvolatile memory device retaining stored data when power supply is interrupted. According to an embodiment the memory device may be a flash memory. The memory device may be a flash memory device having a three-dimensional (3D) stack structure. An example of a non-volatile memory device 150 having a three-dimensional (3D) stack structure is described later herein with reference to FIGS. 2 to 11.

The controller 130 of the memory system 110 may control the memory device 150 in response to a request from the host 102. The controller 130 may provide data read from the memory device 150, to the host 102, and store the data provided from the host 102 into the memory device 150. To this end, the controller 130 may control overall operations of the memory device 150, such as read, write, program and erase operations.

Any suitable controller may be used. For example, the controller 130 may include a host interface unit 132, a processor 134, an error correction code (ECC) unit 138, a power management unit 140, a NAND flash controller 142, and a memory 144.

The host interface unit 132 may process commands and/or data provided from the host 102. The host interface unit 132 may communicate with the host 102 through at least one of various interface protocols such as universal serial bus (USB), multimedia card (MMC), peripheral component interconnect-express (PCI-E), serial attached SCSI (SAS), serial advanced technology attachment (SATA), parallel advanced technology attachment (PATA), small computer system interface (SCSI), enhanced small disk interface (ESDI), integrated drive electronics (IDE) and the like.

The ECC unit 138 may detect and correct errors in the data read from the memory device 150 during a read operation. Various detection and correction techniques may be employed. For example, the ECC unit 138 may not correct error bits when the number of the error bits is greater than or equal to a threshold number of correctable error bits, and may output an error correction fail signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and the like. The ECC unit 138 may include any and all suitable circuits, systems or devices required for an error detection and correction operation.

The PMU 140 may provide and manage power for the controller 130, that is, power for the component elements included in the controller 130.

The NFC 142 may serve as a memory interface between the controller 130 and the memory device 150 to allow the controller 130 to control the memory device 150 in response to a request from the host 102. The NFC 142 may generate control signals for the memory device 150. The NFC may process data under the control of the processor 134, for example when the memory device 150 is a flash memory and, in particular, when the memory device 150 is a NAND flash memory.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read, write, program and erase operations.

The memory 144 may be implemented with volatile memory. For example, the memory 144 may be implemented with a static random access memory (SRAM) or a dynamic random access memory (DRAM). As described above, the memory 144 may store data used by the host 102 and the memory device 150 for the read and write operations. To store the data, the memory 144 may include a program memory, a data memory, a write buffer, a read buffer, a map buffer, and so forth.

The processor 134 may control one or more general operations of the memory system 110. The processor 134 may control a write operation or a read operation for the memory device 150, in response to a write request or a read request from the host 102. The processor 134 may drive firmware, which is referred to as a flash translation layer (FTL), to control the general operations of the memory system 110. The processor 134 may be implemented with a microprocessor. The processor may be implemented with a central processing unit (CPU).

A management unit (not shown) may be included in the processor 134, and may perform, for example, bad block management of the memory device 150. Accordingly, the management unit may find bad memory blocks included in the memory device 150, which are in unsatisfactory condition for further use, and perform bad block management on the bad memory blocks. When the memory device 150 is a flash memory, for example, a NAND flash memory, a program failure may occur during a write operation due to characteristics of a NAND logic function. Bad block management may program the data of the program-failed memory block or the bad memory block into a new memory block. Bad blocks due to a program fall may deteriorate the utilization efficiency of a memory device, especially one having a 3D stack structure and thus negatively affect the reliability of the memory system 100.

Figure 2:
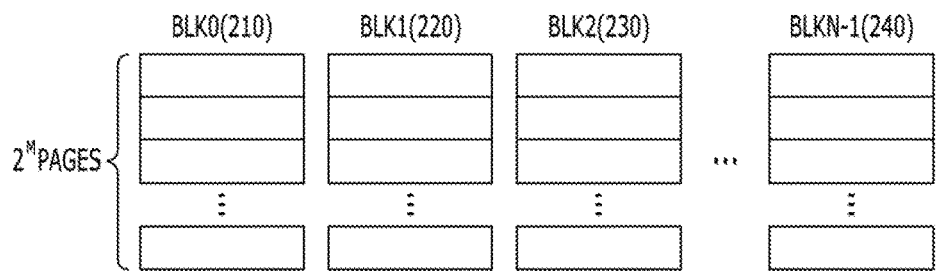
FIG. 2 is a diagram illustrating a memory device in the memory system shown in FIG. 1.

Referring to FIG. 2, according to an embodiment, the memory device 150 may include a plurality of memory blocks, for example, zeroth to (N−1)$^{th}$ blocks 210 to 240. Each of the plurality of memory blocks 210 to 240 may include a plurality of pages, for example, $2^M$ number of pages ($2^M$ PAGES). Each of the plurality of pages may include a plurality of memory cells to which a plurality of word lines is electrically coupled.

The memory blocks may be single level cell (SLC) memory blocks or multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. A MLC memory block including a plurality of pages which are implemented with memory cells that are each capable of storing 3-bit data may be employed and will be referred to as a triple level cell (TLC) memory block.

Each of the plurality of memory blocks 210 to 240 may store data provided from the host device 102 during a write operation, and may provide stored data to the host 102 during a read operation.

Figure 3:
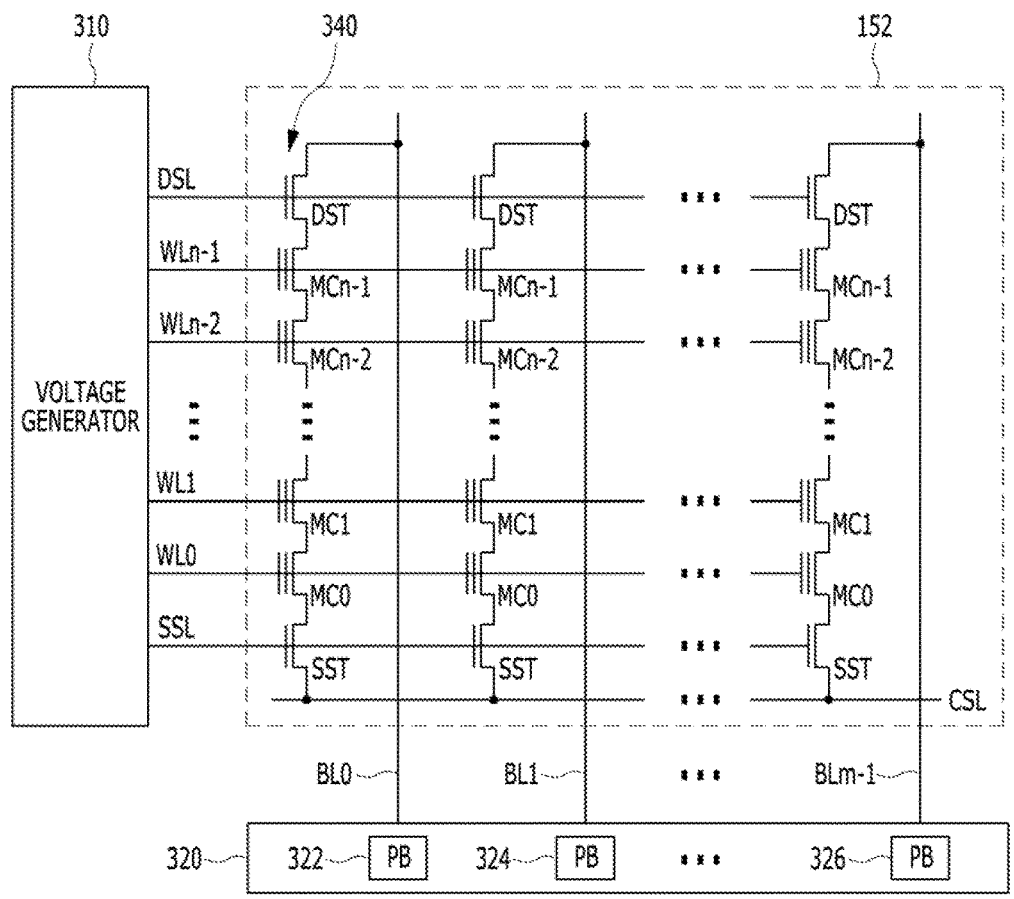
FIG. 3 is a circuit diagram illustrating a memory block in a memory device in an embodiment of the present invention.

Referring to FIG. 3, a memory block 152 of the memory device 150 may include a plurality of cell strings 340 which are electrically coupled to bit lines BL0 to BLm−1, respectively. The cell string 340 of each column may include at least one drain select transistor DST and at least one source select transistor SST. A plurality of memory cells or a plurality of memory cell transistors MC0 to MCn−1 may be electrically coupled in series between the select transistors DST and SST. The respective memory cells MC0 to MCn−1 may be configured by multi-level cells (MLC) each of which stores data information of a plurality of bits. The strings 340 may be electrically coupled to the corresponding bit lines BL0 to BLm−1, respectively. For reference, in FIG. 3, 'DSL' denotes a drain select line, 'SSL' denotes a source select line, and 'CSL' denotes a common source line.

While the memory block 152 is configured by NAND flash memory cells, it is to be noted that the memory block 152 may be realized, in other embodiments, by NOR flash memory, hybrid flash memory in which at least two kinds of memory cells are combined, or one-NAND flash memory in which a controller is built in a memory chip. Also, the operational characteristics of a semiconductor device may be applied to not only a flash memory device in which a charge storing layer is configured by conductive floating gates but also to a charge trap flash (CTF) in which a charge storing layer is configured by a dielectric layer.

A voltage supply block 310 of the memory device 150 may provide word line voltages, for example, a program voltage, a read voltage or a pass voltage, to be supplied to respective word lines according to an operation mode. The voltage supply block 310 may provide voltages to be supplied to bulks, for example, well regions in which the memory cells are formed. The voltage supply block 310 may perform a voltage generating operation under the control of a control circuit (not shown). The voltage supply block 310 may generate a plurality of variable read voltages to generate a plurality of read data, select one of the memory blocks or sectors of a memory cell array under the control of the control circuit, select one of the word lines of the selected memory block, and provide the word line voltages to the selected word line and unselected word lines.

A read/write circuit 320 of the memory device 150 may be controlled by the control circuit, and may serve as a sense amplifier or a write driver according to an operation mode. During a verification/normal read operation, the read/write circuit 320 may serve as a sense amplifier for reading data from the memory cell array. Also, during a program operation, the read/write circuit 320 may serve as a write driver which drives bit lines according to data to be stored in the memory cell array. The read/write circuit 320 may receive data to be written in the memory cell array, from a buffer (not shown), during the program operation, and may drive the bit lines according to the inputted data. To this end, the read/write circuit 320 may include a plurality of page buffers 322, 324 and 326 respectively corresponding to columns (or bit lines) or pairs of columns (or pairs of bit lines), and a plurality of latches (not shown) may be included in each of the page buffers 322, 324 and 326.

FIGS. 4 to 11 are schematic diagrams illustrating various aspects of a memory device 150.

As shown in FIGS. 4 to 11, the memory device 150 may include a plurality of memory blocks BLK0 to BLKN-1, and each of the memory blocks BLK0 to BLKN-1 may be realized in a three-dimensional (3D) structure or a vertical structure. The respective memory blocks BLK0 to BLKN-1 may include structures which extend in first to third directions, for example, an x-axis direction, a y-axis direction and a z-axis direction.

Figure 8:
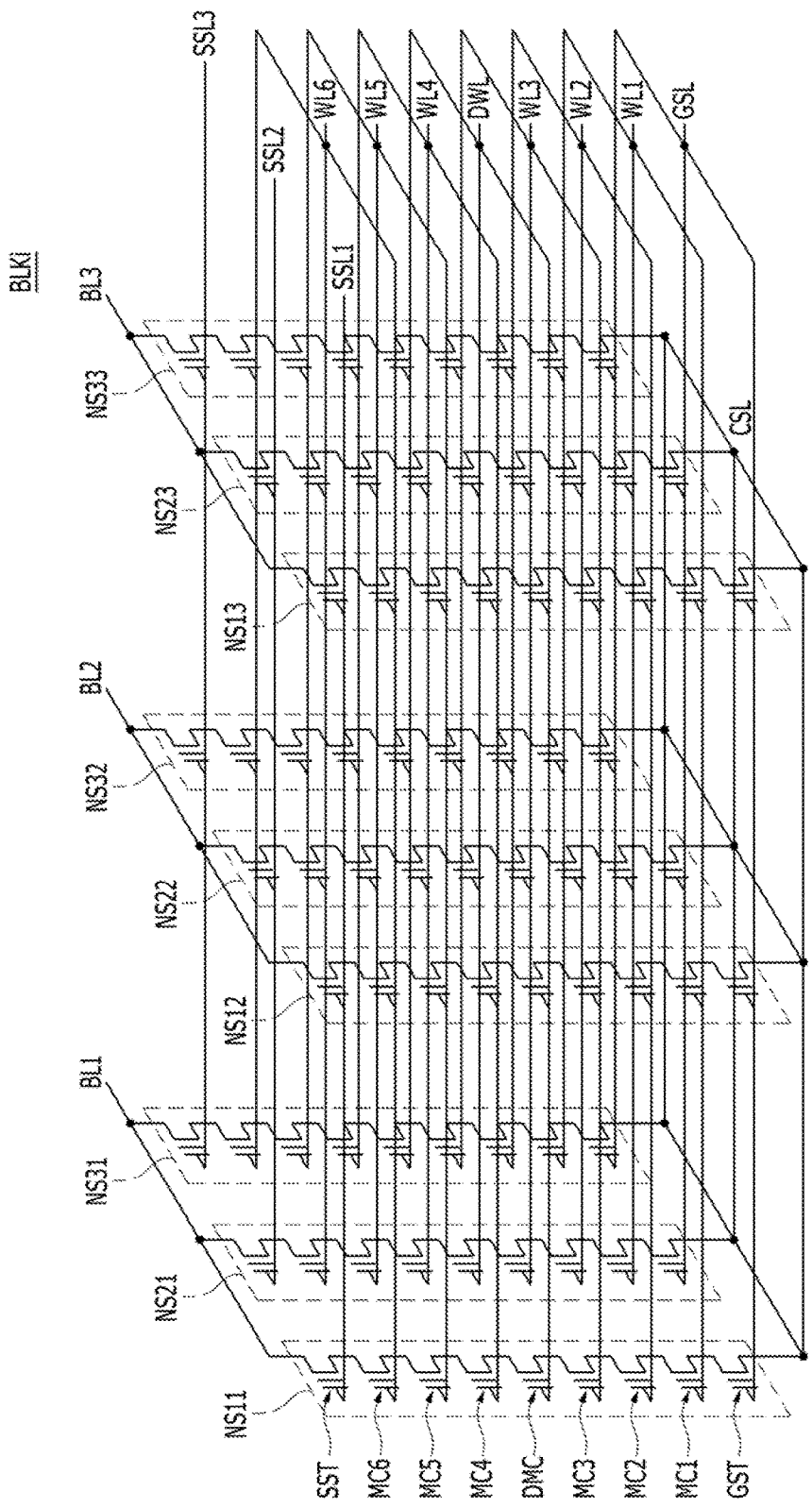

The respective memory blocks BLK0 to BLKN-1 may include a plurality of NAND strings NS which extend in the second direction (FIG. 8). The plurality of NAND strings NS may be provided in the first direction and the third direction. Each NAND string NS may be electrically coupled to a bit line BL, at least one source select line SSL, at least one ground select line GSL, a plurality of word lines WL, at least one dummy word line DWL, and a common source line CSL. The respective memory blocks BLK0 to BLKN-1 may be electrically coupled to a plurality of bit lines BL, a plurality of source select lines SSL, a plurality of ground select lines GSL, a plurality of word lines WL, a plurality of dummy word lines DWL, and a plurality of common source lines CSL.

Figure 4:
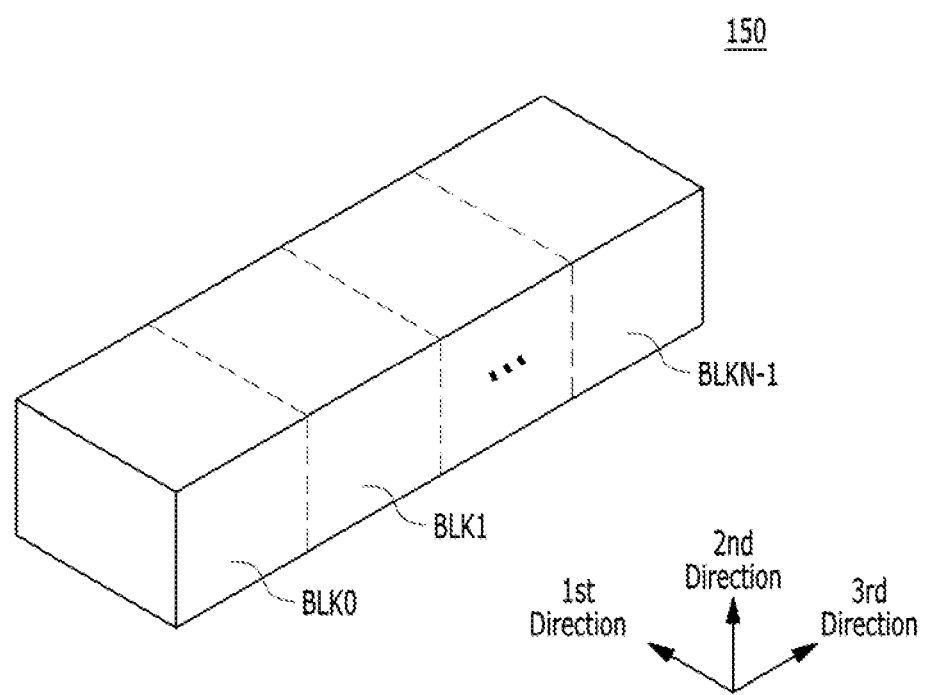
FIGS. 4 to 11 are diagrams schematically illustrating the memory device shown in FIG. 2.
Figure 5:
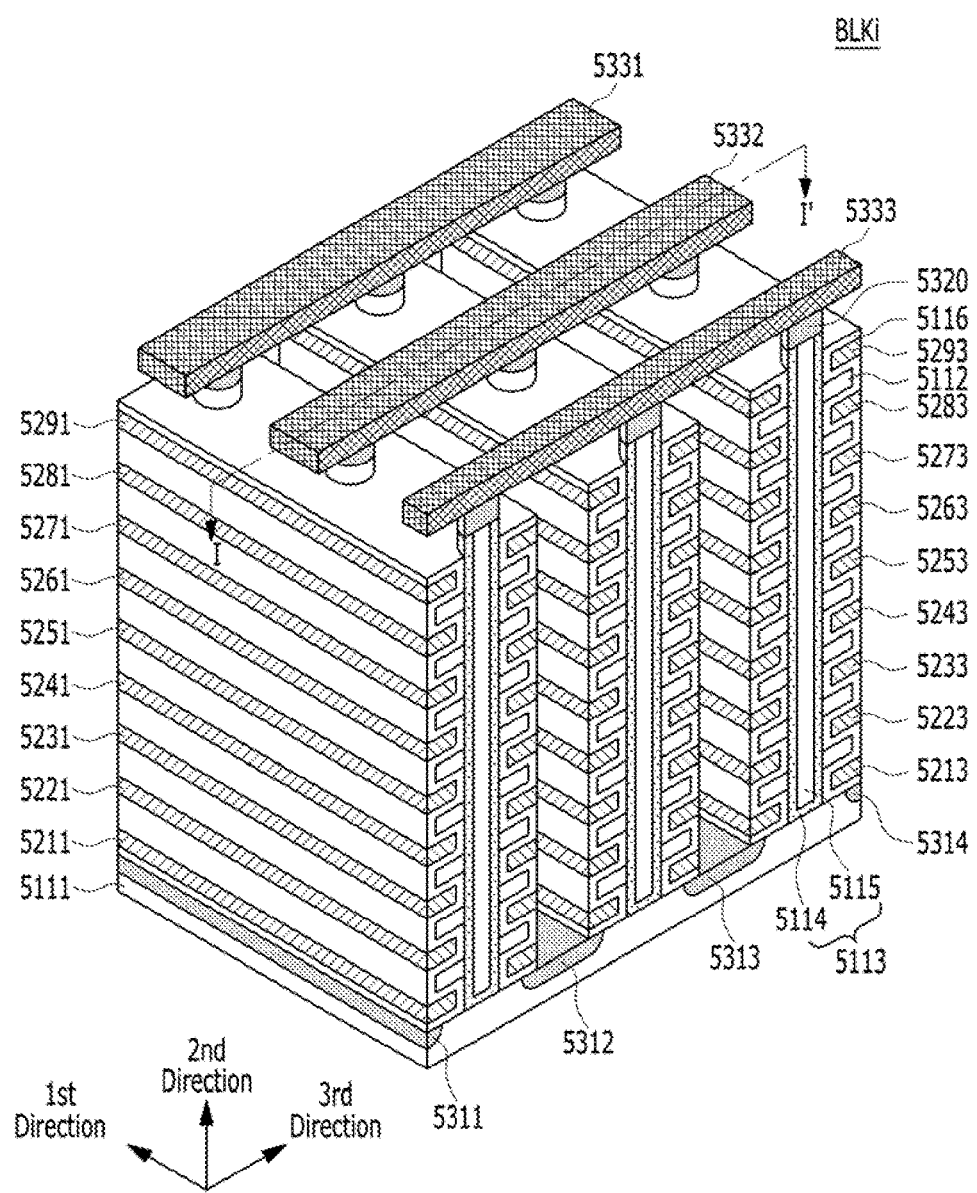
Figure 6:
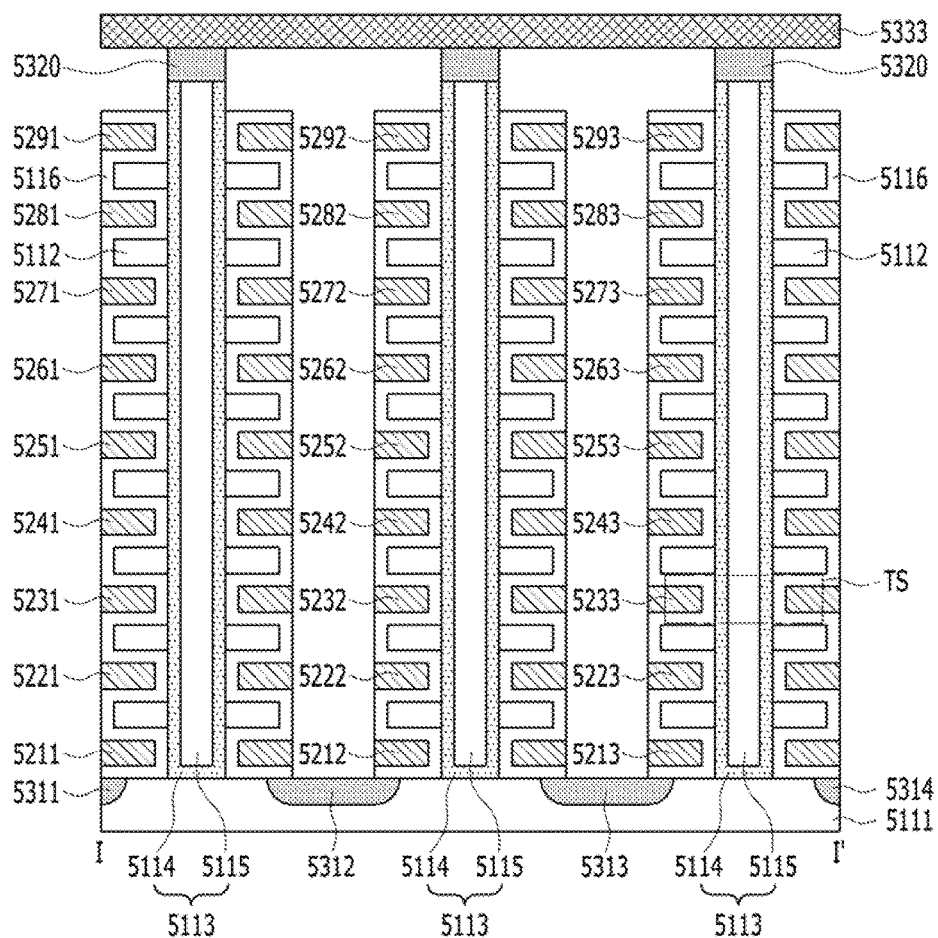

FIG. 5 is a perspective view of one memory block BLKi of the plurality memory blocks BLK0 to BLKN-1 shown in FIG. 4. FIG. 6 is a cross-sectional view taken along a line I-I' of the memory block BLKi shown in FIG. 5.

Referring to FIGS. 5 and 6, memory block BLKi may include a structure which extends in the first to third directions.

The memory block may include a substrate 5111 including a silicon material doped with a first type impurity. For example, the substrate 5111 may include a silicon material doped with a p-type impurity or may be a p-type well, for example, a pocket p-well, and include an n-type well which surrounds the p-type well. While in the embodiment shown it is assumed that the substrate 5111 is p-type silicon, it is to be noted that the substrate 5111 is not limited to being p-type silicon.

A plurality of doping regions 5311 to 5314 which extend in the first direction may be provided over the substrate 5111. The doping regions are spaced apart at regular intervals in the third direction. The plurality of doping regions 5311 to 5314 may contain a second type of impurity that is different from the impurity used in substrate 5111. For example, the plurality of doping regions 5311 to 5314 may be doped with an n-type impurity. While it is assumed here that first to fourth doping regions 5311 to 5314 are n-type, it is to be noted that the first to fourth doping regions 5311 to 5314 are not limited to being n-type.

In the region over the substrate 5111 between the first and second doping regions 5311 and 5312, a plurality of dielectric material regions 5112 which extend in the first direction may be spaced apart at regular intervals in the second direction. The dielectric material regions 5112 and the substrate 5111 may also be separated from one another by a predetermined distance in the second direction. The dielectric material regions 5112 may include any suitable dielectric material such as, for example, silicon oxide.

In the regions over the substrate 5111 between two consecutive doping regions, for example, between doping regions 5311 and 5312, a plurality of pillars 5113 are spaced apart at regular intervals in the first direction. The pillars 5113 extend in the second direction and may pass through the dielectric material regions 5112 so that they may be electrically coupled with the substrate 5111. Each pillar 5113 may include one or more materials. For example, each pillar 5113 may include an in inner layer 5115 and an outer surface layer 5114. The surface layer 5114 may include a doped silicon material doped with an impurity. For example, the surface layer 5114 may include a silicon material doped with the same or same type impurity as the substrate 5111. While it is assumed here, as an example, that the surface layer 5114 may include p-type silicon, the surface layer 5114 is not limited to being p-type silicon and other embodiments may readily envisaged by the skilled person wherein the substrate 5111 and the surface layer 5114 of the pillars 5113 may be doped with an n-type impurity.

The inner layer 5115 of each pillar 5113 may be formed of a dielectric material. The inner layer 5115 may be or include a dielectric material such as, for example, silicon oxide.

In the regions between the first and second doping regions 5311 and 5312, a dielectric layer 5116 may be provided along the exposed surfaces of the dielectric material regions 5112, the pillars 5113 and the substrate 5111. The thickness of the dielectric layer 5116 may be less than one half of the distance between the dielectric material regions 5112. In other words, a region in which a material other than the dielectric material 5112 and the dielectric layer 5116 may be disposed, may be provided between (i) the dielectric layer 5116 (provided over the bottom surface of a first dielectric material of the dielectric material regions 5112) and (ii) the dielectric layer 5116 provided over the top surface of a second dielectric material of the dielectric material regions 5112. The dielectric material regions 5112 lie below the first dielectric material.

In the regions between consecutive doping regions such as in the region between the first and second doping regions 5311 and 5312, a plurality of conductive material regions 5211 to 5291 may be provided over the exposed surface of the dielectric layer 5116. The plurality of the conductive material regions extend in the first direction and are spaced apart at regular intervals in the second direction in an interleaving configuration with the plurality of the dielectric material regions 5112. The dielectric layers 5116 fill the space between the conductive material regions and the dielectric material regions 5112. So for example, the conductive material region 5211 which extends in the first direction may be provided between the dielectric material region 5112 adjacent to the substrate 5111 and the substrate 5111. In particular, the conductive material region 5211 which extends in the first direction may be provided between (I) the dielectric layer 5116 disposed over the substrate 5111 and (ii) the dielectric layer 5116 disposed over the bottom surface of the dielectric material region 5112 adjacent to the substrate 5111.

Each of the conductive material regions 5211 to 5291 which extends in the first direction may be provided between (i) a dielectric layer 5116 disposed over the top surface of one of the dielectric material regions 5112 and (ii) the dielectric layer 5116 disposed over the bottom surface of the next dielectric material region 5112. The conductive material regions 5221 to 5281 which extend in the first direction may be provided between the dielectric material regions 5112. The conductive material region 5291 which extends in the first direction may be provided over the uppermost dielectric material 5112. The conductive material regions 5211 to 5291 which extend in the first direction may be or include a metallic material. The conductive material regions 5211 to 5291 which extend in the first direction may be or include a conductive material such as polysilicon.

In the region between the second and third doping regions 5312 and 5313, the same structures as the structures between the first and second doping regions 5311 and 5312 may be provided. For example, in the region between the second and third doping regions 5312 and 5313, the plurality of dielectric material regions 5112 which extend in the first direction, the plurality of pillars 5113 which are sequentially arranged in the first direction and pass through the plurality of dielectric material regions 5112 in the second direction, the dielectric layer 5116 which is provided over the exposed surfaces of the plurality of dielectric material regions 5112 and the plurality of pillars 5113, and the plurality of conductive material regions 5212 to 5292 which extend in the first direction may be provided.

In the region between the third and fourth doping regions 5313 and 5314, the same structures as between the first and second doping regions 5311 and 5312 may be provided. For example, in the region between the third and fourth doping regions 5313 and 5314, the plurality of dielectric material regions 5112 which extend in the first direction, the plurality of pillars 5113 which are sequentially arranged in the first direction and pass through the plurality of dielectric material regions 5112 in the second direction, the dielectric layer 5116 which is provided over the exposed surfaces of the plurality of dielectric material regions 5112 and the plurality of pillars 5113, and the plurality of conductive material regions 5213 to 5293 which extend in the first direction may be provided.

Drains 5320 may be respectively provided over the plurality of pillars 5113. The drains 5320 may be silicon materials doped with second type impurities. The drains 5320 may be silicon materials doped with n-type impurities. While it is assumed for the sake of convenience that the drains 5320 include n-type silicon, it is to be noted that the drains 5320 are not limited to being n-type silicon. For example, the width of each drain 5320 may be larger than the width of each corresponding pillar 5113. Each drain 5320 may be provided in the shape of a pad over the top surface of each corresponding pillar 5113.

Conductive material regions 5331 to 5333 which extend in the third direction may be provided over the drains 5320. The conductive material regions 5331 to 5333 may be sequentially disposed in the first direction. The respective conductive material regions 5331 to 5333 may be electrically coupled with the drains 5320 of corresponding regions. The drains 5320 and the conductive material regions 5331 to 5333 which extend in the third direction may be electrically coupled with through contact plugs. The conductive material regions 5331 to 5333 which extend in the third direction may be a metallic material. The conductive material regions 5331 to 5333 which extend in the third direction may be a conductive material such as polysilicon.

In FIGS. 5 and 6, the respective pillars 5113 may form strings together with the dielectric layer 5116 and the conductive material regions 5211 to 5291, 5212 to 5292 and 5213 to 5293 which extend in the first direction. The respective pillars 5113 may form NAND strings NS together with the dielectric layer 5116 and the conductive material regions 5211 to 5291, 5212 to 5292 and 5213 to 5293 which extend in the first direction. Each NAND string NS may include a plurality of transistor structures TS.

Figure 7:
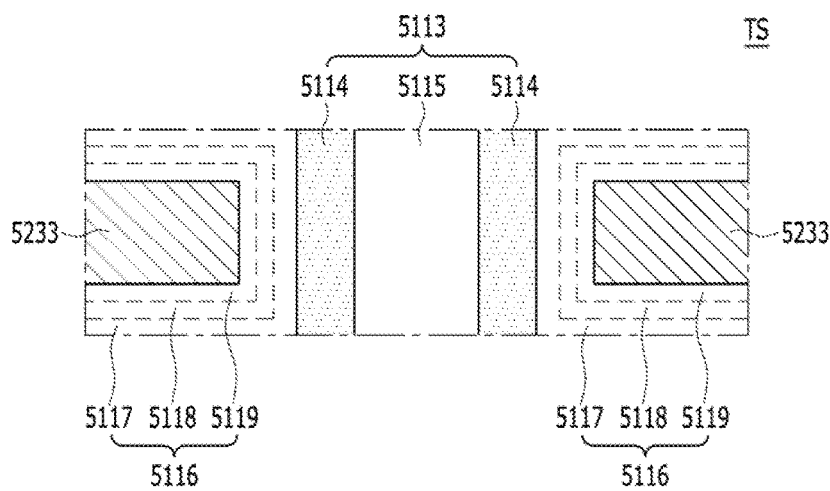

FIG. 7 is a cross-sectional view of the transistor structure TS shown in FIG. 6.

Referring to FIG. 7, in the transistor structure TS shown in FIG. 6, the dielectric layer 5116 may include first to third sub dielectric layers 5117, 5118 and 5119.

The surface layer 5114 of p-type silicon in each of the pillars 5113 may serve as a body. The first sub dielectric layer 5117 adjacent to the pillar 5113 may serve as a tunneling dielectric layer, and may include a thermal oxidation layer.

The second sub dielectric layer 5118 may serve as a charge storing layer. The second sub dielectric layer 5118 may serve as a charge capturing layer, and may include a nitride layer or a metal oxide layer such as an aluminum oxide layer, a hafnium oxide layer, or the like.

The third sub dielectric layer 5119 adjacent to the conductive material 5233 may serve as a blocking dielectric layer. The third sub dielectric layer 5119 adjacent to the conductive material 5233 which extends in the first direction may be formed as a single layer or multiple layers. The third sub dielectric layer 5119 may be a high-k dielectric layer such as an aluminum oxide layer, a hafnium oxide layer, or the like, which has a dielectric constant greater than the first and second sub dielectric layers 5117 and 5118.

The conductive material 5233 may serve as a gate or a control gate. That is, the gate or the control gate 5233, the blocking dielectric layer 5119, the charge storing layer 5118, the tunneling dielectric layer 5117 and the body 5114 may form a transistor or a memory cell transistor structure. For example, the first to third sub dielectric layers 5117 to 5119 may form an oxide-nitride-oxide (ONO) structure. In the embodiment, for the sake of convenience, the surface layer 5114 of p-type silicon in each of the pillars 5113 will be referred to as a body in the second direction.

The memory block BLKi may include the plurality of pillars 5113. Namely, the memory block BLKi may include the plurality of NAND strings NS. In detail, the memory block BLKi may include the plurality of NAND strings NS which extend in the second direction or a direction perpendicular to the substrate 5111.

Each NAND string NS may include the plurality of transistor structures TS which are disposed in the second direction. At least one of the plurality of transistor structures TS of each NAND string NS may serve as a string source transistor SST. At least one of the plurality of transistor structures TS of each NAND string NS may serve as a ground select transistor GST.

The gates or control gates may correspond to the conductive material regions 5211 to 5291, 5212 to 5292 and 5213 to 5293 which extend in the first direction. In other words, the gates or the control gates may extend in the first direction and form word lines and at least two select lines, at least one source select line SSL and at least one ground select line GSL.

The conductive material regions 5331 to 5333 which extend in the third direction may be electrically coupled to one end of the NAND strings NS. The conductive material regions 5331 to 5333 which extend in the third direction may serve as bit lines BL. That is, in one memory block BLKi, the plurality of NAND strings NS may be electrically coupled to one bit line BL.

The second type doping regions 5311 to 5314 which extend in the first direction may be provided to the other ends of the NAND strings NS. The second type doping regions 5311 to 5314 which extend in the first direction may serve as common source lines CSL.

Namely, the memory block BLKi may include a plurality of NAND strings NS which extend in a direction perpendicular to the substrate 5111, e.g., the second direction, and may serve as a NAND flash memory block, for example, of a charge capturing type memory, in which a plurality of NAND strings NS are electrically coupled to one bit line BL.

While it is illustrated in FIGS. 5 to 7 that the conductive material regions 5211 to 5291, 5212 to 5292 and 5213 to 5293 which extend in the first direction are provided in 9 layers, it is to be noted that the conductive material regions 5211 to 5291, 5212 to 5292 and 5213 to 5293 which extend in the first direction are not limited to being provided in 9 layers. For example, conductive material regions which extend in the first direction may be provided in 8 layers, 16 layers or any multiple of layers. In other words, in one NAND string NS, the number of transistors may be 8, 16 or more.

While it is illustrated in FIGS. 5 to 7 that 3 NAND strings NS are electrically coupled to one bit line BL, it is to be noted that the embodiment is not limited to having 3 NAND strings NS that are electrically coupled to one bit line BL. In the memory block BLKi, m number of NAND strings NS may be electrically coupled to one bit line BL, m being a positive integer. According to the number of NAND strings NS which are electrically coupled to one bit line BL, the number of conductive material regions 5211 to 5291, 5212 to 5292 and 5213 to 5293 which extend in the first direction and the number of common source lines 5311 to 5314 may be controlled as well.

Further, while it is illustrated in FIGS. 5 to 7 that 3 NAND strings NS are electrically coupled to one conductive material which extends in the first direction, it is to be noted that the embodiment is not limited to having 3 NAND strings NS electrically coupled to one conductive material which extends in the first direction. For example, n number of NAND strings NS may be electrically coupled to one conductive material which extends in the first direction, n being a positive integer. According to the number of NAND strings NS which are electrically coupled to one conductive material which extends in the first direction, the number of bit lines 5331 to 5333 may be controlled as well.

FIG. 8 is an equivalent circuit diagram illustrating the memory block BLKi having a first structure as described with reference to FIGS. 5 to 7.

Referring to FIG. 8, block BLKi, may have a plurality of NAND strings NS11 to NS31 between a first bit line BL1 and a common source line CSL. The first bit line BL1 may correspond to the conductive material region 5331 of FIGS. 5 and 6, which extends in the third direction. NAND strings NS12 to NS32 may be provided between a second bit line BL2 and the common source line CSL. The second bit line BL2 may correspond to the conductive material region 5332 of FIGS. 5 and 6, which extends in the third direction. NAND strings NS13 to NS33 may be provided between a third bit line BL3 and the common source line CSL. The third bit line BL3 may correspond to the conductive material region 5333 of FIGS. 5 and 6, which extends in the third direction.

A source select transistor SST of each NAND string NS may be electrically coupled to a corresponding bit line BL. A ground select transistor GST of each NAND string NS may be electrically coupled to the common source line CSL. Memory cells MC may be provided between the source select transistor SST and the ground select transistor GST of each NAND string NS.

In this example, NAND strings NS may be defined by units of rows and columns and NAND strings NS which are electrically coupled to one bit line may form one column. The NAND strings NS11 to NS31 which are electrically coupled to the first bit line BL1 may correspond to a first column, the NAND strings NS12 to NS32 which are electrically coupled to the second bit line BL2 may correspond to a second column, and the NAND strings NS13 to NS33 which are electrically coupled to the third bit line BL3 may correspond to a third column. NAND strings NS which are electrically coupled to one source select line SSL may form one row. The NAND strings NS11 to NS13 which are electrically coupled to a first source select line SSL1 may form a first row, the NAND strings NS21 to NS23 which are electrically coupled to a second source select line SSL2 may form a second row, and the NAND strings NS31 to NS33 which are electrically coupled to a third source select line SSL3 may form a third row.

In each NAND string NS, a height may be defined. In each NAND string NS, the height of a memory cell MC1 adjacent to the ground select transistor GST may have a value '1'. In each NAND string NS, the height of a memory cell may increase as the memory cell gets closer to the source select transistor SST when measured from the substrate 5111. For example, in each NAND string NS, the height of a memory cell MC6 adjacent to the source select transistor SST may be 7.

The source select transistors SST of the NAND strings NS in the same row may share the source select line SSL. The source select transistors SST of the NAND strings NS in different rows may be respectively electrically coupled to the different source select lines SSL1, SSL2 and SSL3.

The memory cells at the same height in the NAND strings NS in the same row may share a word line WL. That is, at the same height, the word lines WL electrically coupled to the memory cells MC of the NAND strings NS in different rows may be electrically coupled. Dummy memory cells DMC at the same height in the NAND strings NS of the same row may share a dummy word line DWL. Namely, at the same height or level, the dummy word lines DWL electrically coupled to the dummy memory cells DMC of the NAND strings NS in different rows may be electrically coupled.

The word lines WL or the dummy word lines DWL located at the same level or height or layer may be electrically coupled with one another at layers where the conductive material regions 5211 to 5291, 5212 to 5292 and 5213 to 5293 which extend in the first direction may be provided. The conductive material regions 5211 to 5291, 5212 to 5292 and 5213 to 5293 which extend in the first direction may be electrically coupled in common to upper layers through contacts. At the upper layers, the conductive material regions 5211 to 5291, 5212 to 5292 and 5213 to 5293 which extend in the first direction may be electrically coupled. In other words, the ground select transistors GST of the NAND strings NS in the same row may share the ground select line GSL. Further, the ground select transistors GST of the NAND strings NS in different rows may share the ground select line GSL. That is, the NAND strings NS11 to NS13, NS21 to NS23 and NS31 to NS33 may be electrically coupled to the ground select line GSL.

The common source line CSL may be electrically coupled to the NAND strings NS. Over the active regions and over the substrate 5111, the first to fourth doping regions 5311 to 5314 may be electrically coupled. The first to fourth doping regions 5311 to 5314 may be electrically coupled to an upper layer through contacts and, at the upper layer, the first to fourth doping regions 5311 to 5314 may be electrically coupled.

For example, as shown in FIG. 8, the word lines WL of the same height or level may be electrically coupled. Accordingly, when a word line WL at a specific height is selected, all NAND strings NS which are electrically coupled to the word line WL may be selected. The NAND strings NS in different rows may be electrically coupled to different source select lines SSL. Accordingly, among the NAND strings NS electrically coupled to the same word line WL, by selecting one of the source select lines SSL1 to SSL3, the NAND strings NS in the unselected rows may be electrically isolated from the bit lines BL1 to BL3. In other words, by selecting one of the source select lines SSL1 to SSL3, a row of NAND strings NS may be selected. Moreover, by selecting one of the bit lines BL1 to BL3, the NAND strings NS in the selected rows may be selected in units of columns.

In each NAND string NS, a dummy memory cell DMC may be provided. In FIG. 8, the dummy memory cell DMC may be provided between a third memory cell MC3 and a fourth memory cell MC4 in each NAND string NS. That is, first to third memory cells MC1 to MC3 may be provided between the dummy memory cell DMC and the ground select transistor GST. Fourth to sixth memory cells MC4 to MC6 may be provided between the dummy memory cell DMC and the source select transistor SST. The memory cells MC of each NAND string NS may be divided into memory cell groups by the dummy memory cell DMC. In the divided memory cell groups, memory cells, for example, MC1 to MC3, adjacent to the ground select transistor GST may be referred to as a lower memory cell group, and memory cells, for example, MC4 to MC6, adjacent to the string select transistor SST may be referred to as an upper memory cell group.

Hereinbelow, detailed descriptions will be made with reference to FIGS. 9 to 11, which show a memory device in a memory system, according to another embodiment of the invention.

Figure 9:
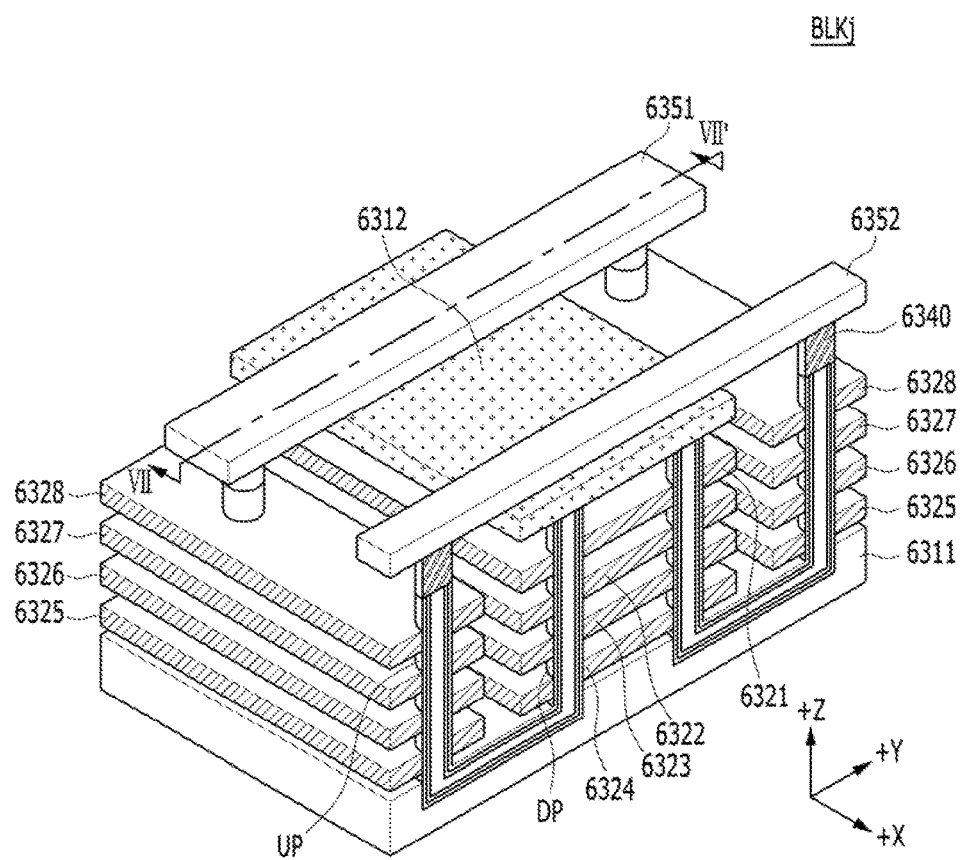

In particular, FIG. 9 is a perspective view schematically illustrating a memory device implemented with a three-dimensional (3D) nonvolatile memory device, which is different from the first structure described above with reference to FIGS. 5 to 8. FIG. 10 is a cross-sectional view illustrating the memory block BLKj taken along the line VII-VII' of FIG. 9.

Figure 10:
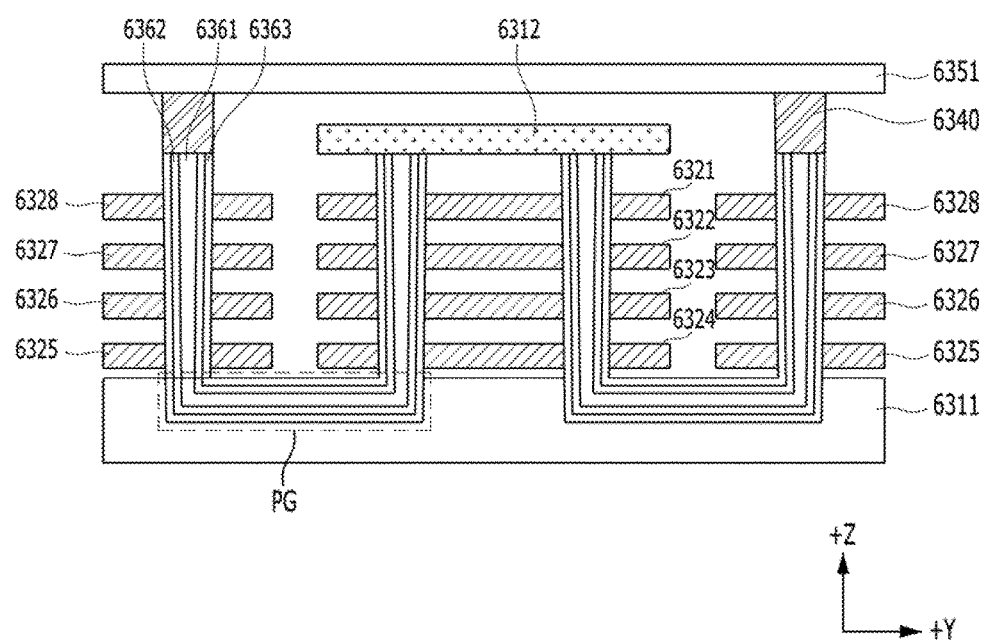

Referring to FIGS. 9 and 10, the memory block BLKj may include structures which extend in the first to third directions and may include a substrate 6311. The substrate 6311 may include a silicon material doped with a first type impurity. For example, the substrate 6311 may include a silicon material doped with a p-type impurity or may be a p-type well, for example, a pocket p-well, and include an n-type well which surrounds the p-type well. While it is assumed in the embodiment shown, that the substrate 6311 is p-type silicon, it is to be noted that the substrate 6311 is not limited to being p-type silicon.

First to fourth conductive material regions 6321 to 6324 which extend in the x-axis direction and the y-axis direction are provided over the substrate 6311. The first to fourth conductive material regions 6321 to 6324 may be separated by a predetermined distance in the z-axis direction.

Fifth to eighth conductive material regions 6325 to 6328 which extend in the x-axis direction and the y-axis direction may be provided over the substrate 6311. The fifth to eighth conductive material regions 6325 to 6328 may be separated by the predetermined distance in the z-axis direction. The fifth to eighth conductive material regions 6325 to 6328 may be separated from the first to fourth conductive material regions 6321 to 6324 in the y-axis direction.

A plurality of lower pillars DP which pass through the first to fourth conductive material regions 6321 to 6324 may be provided. Each lower pillar DP extends in the z-axis direction. Also, a plurality of upper pillars UP which pass through the fifth to eighth conductive material regions 6325 to 6328 may be provided. Each upper pillar UP extends in the z-axis direction.

Each of the lower pillars DP and the upper pillars UP may include an internal material 6361, an intermediate layer 6362, and a surface layer 6363. The intermediate layer 6362 may serve as a channel of the cell transistor. The surface layer 6363 may include a blocking dielectric layer, a charge storing layer and a tunneling dielectric layer.

The lower pillar DP and the upper pillar UP may be electrically coupled through a pipe gate PG. The pipe gate PG may be disposed in the substrate 6311. For instance, the pipe gate PG may include the same material as the lower pillar DP and the upper pillar UP.

A doping material 6312 of a second type which extends in the x-axis direction and the y-axis direction may be provided over the lower pillars DP. For example, the doping material 6312 of the second type may include an n-type silicon material. The doping material 6312 of the second type may serve as a common source line CSL.

Drains 6340 may be provided over the upper pillars UP. The drains 6340 may include an n-type silicon material. First and second upper conductive material regions 6351 and 6352 which extend in the y-axis direction may be provided over the drains 6340.

The first and second upper conductive material regions 6351 and 6352 may be separated in the x-axis direction. The first and second upper conductive material regions 6351 and 6352 may be formed of a metal. The first and second upper conductive material regions 6351 and 6352 and the drains 6340 may be electrically coupled through contact plugs. The first and second upper conductive material regions 6351 and 6352 respectively serve as first and second bit lines BL1 and BL2.

The first conductive material 6321 may serve as a source select line SSL, the second conductive material 6322 may serve as a first dummy word line DWL1, and the third and fourth conductive material regions 6323 and 6324 serve as first and second main word lines MWL1 and MWL2, respectively. The fifth and sixth conductive material regions 6325 and 6326 serve as third and fourth main word lines MWL3 and MWL4, respectively, the seventh conductive material 6327 may serve as a second dummy word line DWL2, and the eighth conductive material 6328 may serve as a drain select line DSL.

The lower pillar DP and the first to fourth conductive material regions 6321 to 6324 adjacent to the lower pillar DP form a lower string. The upper pillar UP and the fifth to eighth conductive material regions 6325 to 6328 adjacent to the upper pillar UP form an upper string. The lower string and the upper string may be electrically coupled through the pipe gate PG. One end of the lower string may be electrically coupled to the doping material 6312 of the second type which serves as the common source line CSL. One end of the upper string may be electrically coupled to a corresponding bit line through the drain 6340. One lower string and one upper string form one cell string which is electrically coupled between the doping material 6312 of the second type serving as the common source line CSL and a corresponding one of the upper conductive material layers 6351 and 6352 serving as the bit line BL.

That is, the lower string may include a source select transistor SST, the first dummy memory cell DMC1, and the first and second main memory cells MMC1 and MMC2. The upper string may include the third and fourth main memory cells MMC3 and MMC4, the second dummy memory cell DMC2, and a drain select transistor DST.

In FIGS. 9 and 10, the upper string and the lower string may form a NAND string NS, and the NAND string NS may include a plurality of transistor structures TS. Since the transistor structure included in the NAND string NS in FIGS. 9 and 10 is described above in detail with reference to FIG. 7, a detailed description thereof will be omitted herein.

Figure 11:
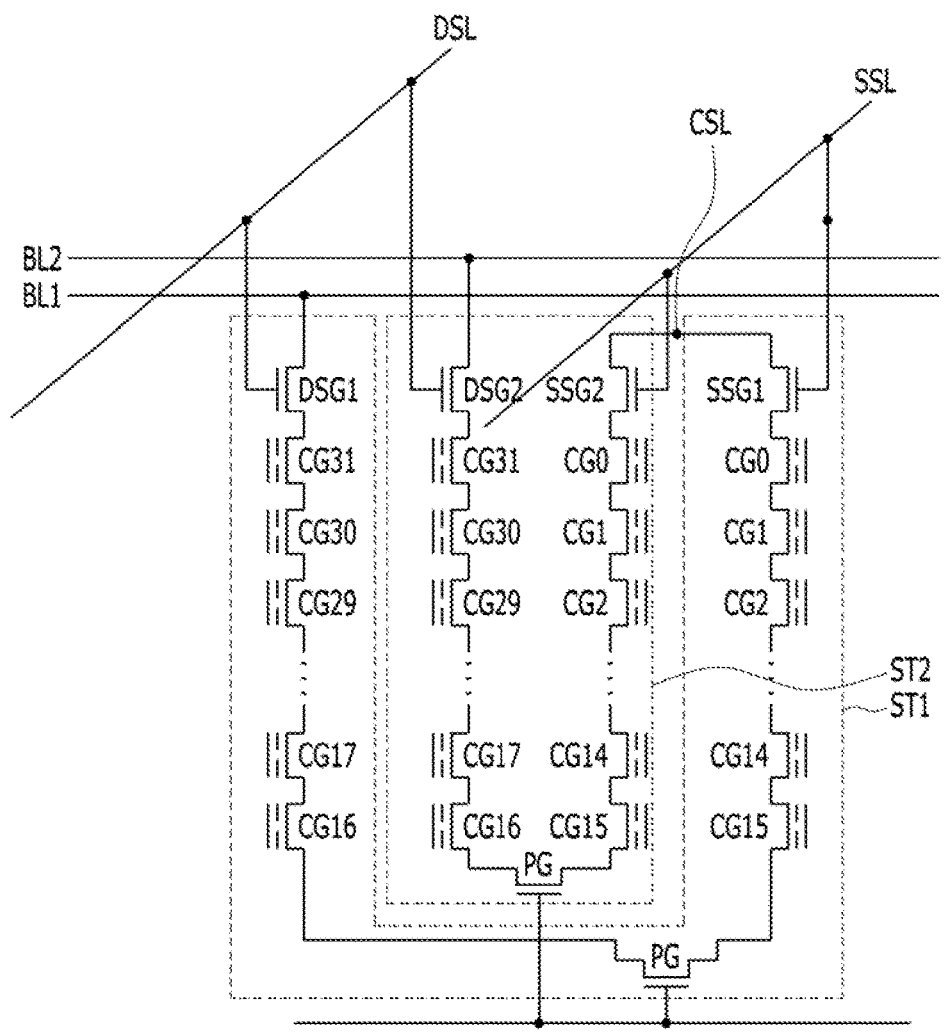

FIG. 11 is a circuit diagram illustrating the equivalent circuit of the memory block BLKj having the second structure as described above with reference to FIGS. 9 and 10. For the sake of convenience, only a first string and a second string, which form a pair in the memory block BLKj in the second structure is shown.

Referring to FIG. 11, in the memory block BLKj having the second structure, cell strings each of which is implemented with one upper string and one lower string electrically coupled through the pipe gate PG as described above with reference to FIGS. 9 and 10, may be provided, in such a way as to define a plurality of pairs.

For example, in the certain memory block BLKj having the second structure, memory cells CG0 to CG31 stacked along a first channel CH1 (not shown), for example, at least one source select gate SSG1 and at least one drain select gate DSG1 may form a first string ST1, and memory cells CG0 to CG31 stacked along a second channel CH2 (not shown), for example, at least one source select gate SSG2 and at least one drain select gate DSG2 may form a second string ST2.

The first string ST1 and the second string ST2 may be electrically coupled to the same drain select line DSL and the same source select line SSL. The first string ST1 may be electrically coupled to a first bit line BL1, and the second string ST2 may be electrically coupled to a second bit line BL2.

While it is described in FIG. 11 that the first string ST1 and the second string ST2 are electrically coupled to the same drain select line DSL and the same source select line SSL, it may be envisaged that the first string ST1 and the second string ST2 may be electrically coupled to the same source select line SSL and the same bit line BL, the first string ST1 may be electrically coupled to a first drain select line DSL1 and the second string ST2 may be electrically coupled to a second drain select line DSL2. Further it may be envisaged that the first string ST1 and the second string ST2 may be electrically coupled to the same drain select line DSL and the same bit line BL, the first string ST1 may be electrically coupled to a first source select line SSL1 and the second string ST2 may be electrically coupled a second source select line SSL2.

FIGS. 12A to 12J are block diagrams that describe a one-shot program operation of a memory system in accordance with a first embodiment.

Referring to FIGS. 12A to 12J, a data processing system 100 such as shown in FIG. 1 includes a plurality of memory devices 1501, 1502, 1503 and 1504 and a cache buffer 1441.

Each of the plurality of memory devices 1501, 1502, 1503 and 1504 is a component corresponding to one memory device 150 described above with reference to FIG. 1.

The cache buffer 1441 is a component corresponding to the write buffer of the memory 144 included in the controller 130 described above with reference to FIG. 1. That is, as described above with reference to FIG. 1, the memory 144 of the controller 130 may include a program memory, a data memory, a write buffer, a read buffer, a map buffer, and so forth. The cache buffer 1441 shown in FIGS. 12A to 12J is a component corresponding to the write buffer.

Figure 12A:
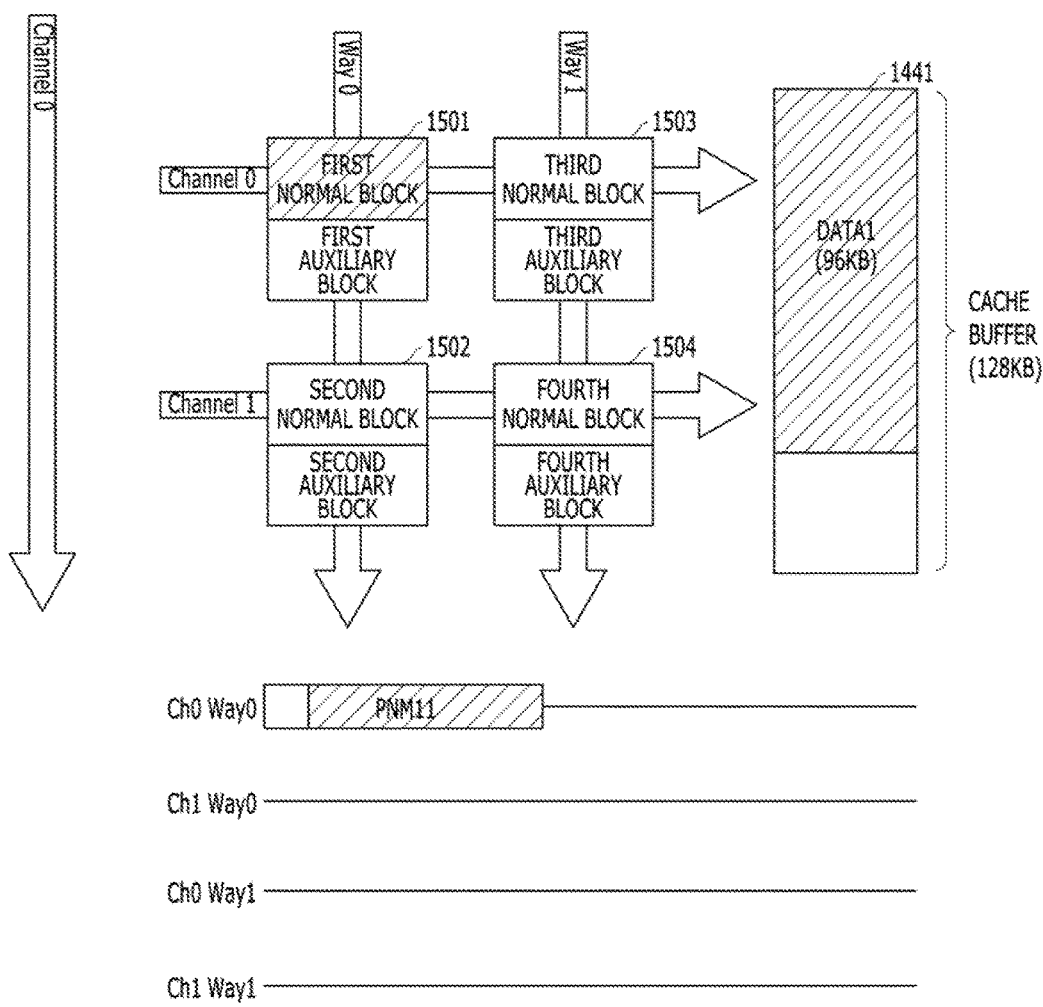
FIGS. 12A to 12J are block diagrams that describe a one-shot program operation of a memory system in accordance with a first embodiment.

IN FIG. 12A, four nonvolatile memory devices are included as the plurality of memory devices 1501, 1502, 1503 and 1504. However, it is to be noted that a greater or lesser number of nonvolatile memory devices may be actually included as the plurality of memory devices 1501, 1502, 1503 and 1504.

A memory system in accordance with the first embodiment will be described below with reference to FIG. 12A. Each of the plurality of memory devices 1501, 1502, 1503 and 1504 includes a normal block and an auxiliary block.

That is, among the plurality of memory devices 1501, 1502, 1503 and 1504, a first memory device 1501 includes a first normal block and a first auxiliary block, a second memory device 1502 includes a second normal block and a second auxiliary block, a third memory device 1503 includes a third normal block and a third auxiliary block, and a fourth memory device 1504 includes a fourth normal block and a fourth auxiliary block.

Furthermore, the normal block of each of the plurality of memory devices 1501, 1502, 1503 and 1504 includes some memory blocks among the plurality of memory blocks 210, 220, 230 and 240 described above with reference to FIG. 2. Additionally, the auxiliary block of each of the plurality of memory devices 1501, 1502, 1503 and 1504 includes some other memory blocks among the plurality of memory blocks 210, 220, 230 and 240. The number of memory blocks included in the normal block of each of the plurality of memory devices 1501, 1502, 1503 and 1504 is larger than the number of memory blocks included in the auxiliary block of each of the plurality of memory devices 1501, 1502, 1503 and 1504.

Further, while not directly shown in the drawing, multilevel cells are included in the normal block of each of the plurality of memory devices 1501, 1502, 1503 and 1504. The multilevel cell means a memory cell capable of storing plural bits of data, as described above with reference to FIG. 3. For example, multilevel cells included in the normal block of each of the plurality of memory devices 1501, 1502, 1503 and 1504 may be triple level cells (TLC) each capable of storing 3-bit data. Therefore, the multilevel cells included in the normal block of each of the plurality of memory devices 1501, 1502, 1503 and 1504 may include multilevel cells each capable of storing data more or less than 3 bits.

While not directly shown in the drawing, single level cells are included in the auxiliary block of each of the plurality of memory devices 1501, 1502, 1503 and 1504. A single level cell means a memory cell capable of storing 1-bit data, as described above with reference to FIG. 3.

Moreover, while not directly shown in the drawing, the controller 130 uses a one-shot program scheme when data is programmed in the normal block of each of the plurality of memory devices 1501, 1502, 1503 and 1504. A one-shot program means an operation of programming plural bits of data in multilevel cells through one program operation.

A data size serving as a reference for a one-shot program may be defined as a predetermined size. For example, the size of data needed to perform a one-shot program without using dummy data for any one page (not shown) included in the first normal block of the first memory device 1501 may be defined as the predetermined size.

For reference, the predetermined size is exemplified as 96 KB in the drawing. However, it is to be noted that the predetermined size may be set as a size larger or smaller than 96 KB.

The plurality of memory devices 1501, 1502, 1503 and 1504 operate in an interleaving scheme. It may be seen from the drawing that the four memory devices included in the plurality of memory devices 1501, 1502, 1503 and 1504 are coupled to each other through two channels CHANNEL0 and CHANNEL1 and two ways WAY0 and WAY1.

While not directly shown in the drawings, in the present disclosure, an address management region (not shown) is included and serves as a component corresponding to the map buffer of the memory 144 included in the controller 130 as described above with reference to FIG. 1.

Mapping information of physical addresses and logical addresses for data stored in each of the plurality of memory devices 1501, 1502, 1503 and 1504 are stored in the address management region.

In the memory system in accordance with the embodiment, mapping information of physical addresses and logical addresses for data stored in the normal block of each of the plurality of memory devices 1501, 1502, 1503 and 1504 are stored in the address management region. Moreover, mapping information of physical addresses and logical addresses for data stored in the auxiliary block of each of the plurality of memory devices 1501, 1502, 1503 and 1504 are not stored in the address management region. Only physical addresses for data stored in the auxiliary block of each of the plurality of memory devices 1501, 1502, 1503 and 1504 are stored in the address management region.

This means that the memory system in accordance with the embodiment handles data which are stored in the normal block of each of the plurality of memory devices 1501, 1502, 1503 and 1504 in the same manner as a conventional general nonvolatile memory device does. In particular, for the normal block of each of the plurality of memory devices 1501, 1502, 1503 and 1504, background operations including a garbage collection operation, a wear leveling operation and a read reclaim operation, may be performed.

Conversely, the memory system in accordance with the embodiment handles data which are stored in the auxiliary block of each of the plurality of memory devices 1501, 1502, 1503 and 1504 in a different manner as a conventional nonvolatile memory device does. In particular, for the auxiliary block of each of the plurality of memory devices 1501, 1502, 1503 and 1504, background operations including a garbage collection operation, a wear leveling operation and a read reclaim operation are not performed.

The reason why the normal block and the auxiliary block included in each of the plurality of memory devices 1501, 1502, 1503 and 1504 are managed differently from each other is due to the auxiliary block backing up the normal block as will be described later in detail. It is inefficient to directly perform one-shot programming in the normal block for data which is smaller than the predetermined size and inputted from a host. Therefore, according to the present disclosure, if data which is inputted from the host is smaller than the predetermined size, the data is backed up in the auxiliary block so that a subsequently inputted data is combined with the data until the size of the combined data becomes as large as the predetermined size. Once the combined data size is as large as the predetermined size, the combined data is transferred to the normal block for the one-shot program.

Since the auxiliary block included in each of the plurality of memory devices 1501, 1502, 1503 and 1504 plays the role of backing up the normal block, it is not necessary to store mapping information of logical addresses and physical addresses for data, which is stored in the auxiliary block included in each of the plurality of memory devices 1501, 1502, 1503 and 1504, in the address management region. Instead, only physical addresses for data stored in the auxiliary block included in each of the plurality of memory devices 1501, 1502, 1503 and 1504 are stored in the address management region.

Furthermore, a physical address designating a location where an empty space of the auxiliary block included in each of the plurality of memory devices 1501, 1502, 1503 and 1504 starts is stored in the address management region, as storage location information. For example, a physical address designating a location where an empty space of the first auxiliary block included in the first memory device 1501 starts is stored in the address management region, as a first storage location information; a physical address designating a location where an empty space of the second auxiliary block included in the second memory device 1502 starts is stored in the address management region, as a second storage location information; a physical address designating a location where an empty space of the third auxiliary block included in the third memory device 1503 starts is stored in the address management region, as a third storage location information; and a physical address designating a location where an empty space of the fourth auxiliary block included in the fourth memory device 1504 starts is stored in the address management region, as a fourth storage location information.

Referring to FIGS. 12A to 12D, the controller 130 controls the plurality of respective memory devices 1501, 1502, 1503 and 1504 when data each having the predetermined size, that is, a plurality of data each of 96 KB, are successively inputted from the host.

Referring to FIG. 12A, the controller 130 buffers first data DATA1 inputted from the host using the cache buffer 1441.

The controller 130 checks the used area of the cache buffer 1441 in which the first data DATA1 is buffered by taking the predetermined size of 96 KB as a reference. As a result, it may be checked that the first data DATA1 is buffered in the cache buffer 1441 and the used area of the cache buffer 1441 is precisely the predetermined size of 96 KB.

Accordingly, the controller 130 may one-shot program the first data DATA1 in any one normal block among the respective normal blocks of the plurality of memory devices 1501, 1502, 1503 and 1504.

As shown in the drawings, the plurality of memory devices 1501, 1502, 1503 and 1504 are in a state in which all of the devices do not perform any operation. Therefore, according to an operation sequence by the interleaving scheme, when the time is appropriate for the first memory device 1501 to operate among the plurality of memory devices 1501, 1502, 1503 and 1504, the controller 130 one-shot programs, as indicated by the reference symbol PNM11, the first data DATA1 in the first normal block of the first memory device 1501.

While performing the one-shot program PNM11 for the first memory device 1501, the controller 130 erases the first data DATA1 from the cache buffer 1441.

Figure 12B:
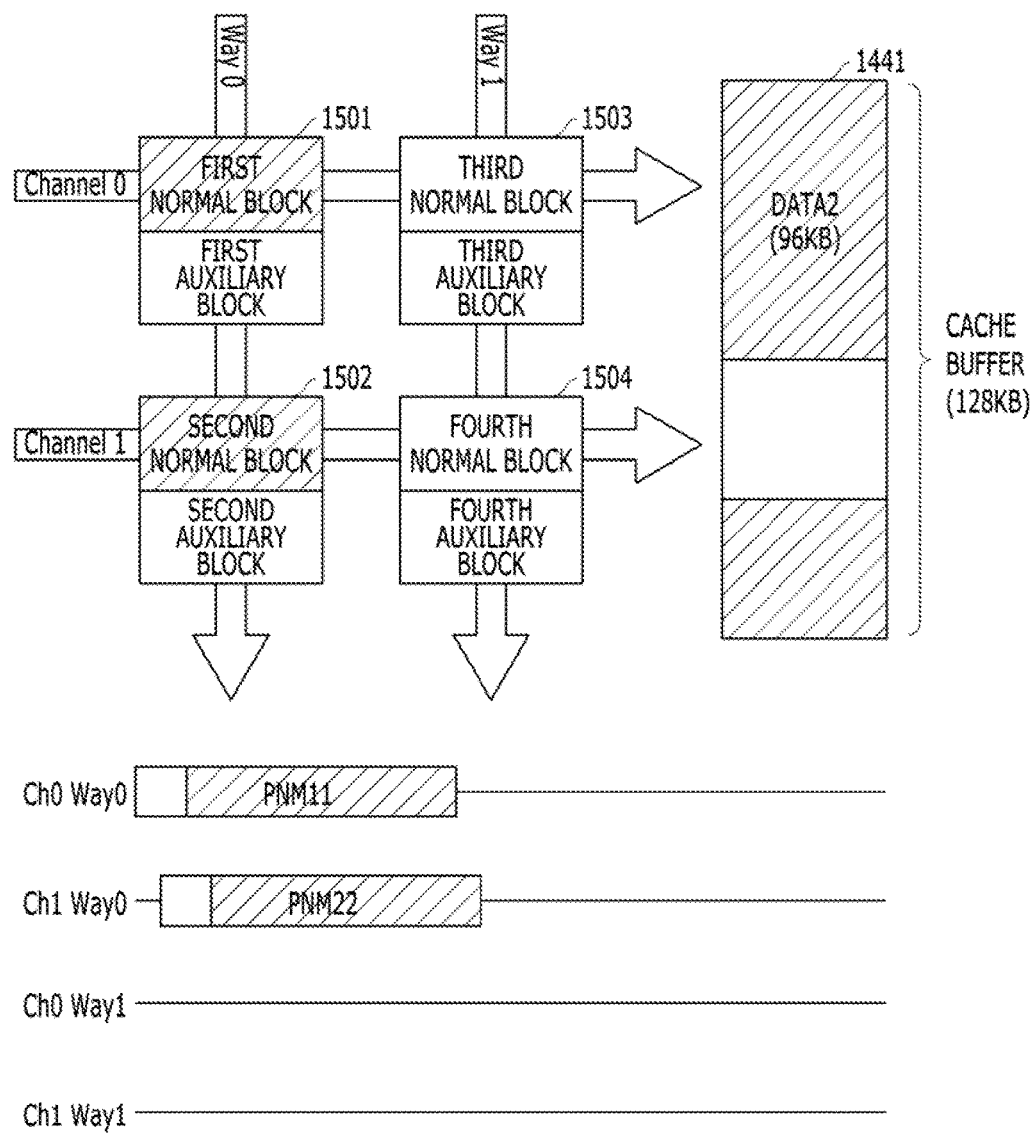

Referring to FIG. 12B, the controller 130 buffers second data DATA2 inputted from the host, in the cache buffer 1441. The controller 130 checks the used area of the cache buffer 1441 in which the second data DATA2 is buffered by taking the predetermined size of 96 KB as a reference. As a result, it may be checked whether the second data DATA2 is buffered in the cache buffer 1441 and the used area of the cache buffer 1441 is precisely the predetermined size of 96 KB.

Accordingly, the controller 130 may one-shot program the second data DATA2 in any one normal block among the respective normal blocks of the plurality of memory devices 1501, 1502, 1503 and 1504.

As shown in the drawings, among the plurality of memory devices 1501, 1502, 1503 and 1504, the first memory device 1501 is in a state in which it performs the operation PNM11 of one-shot programming the first data DATA1 in the first normal block, and the remaining second to fourth memory devices 1502, 1503 and 1504 are in a state in which they do not perform any operation. Therefore, according to the operation sequence by the interleaving scheme, when a time for the second memory device 1502 to operate among the plurality of memory devices 1501, 1502, 1503 and 1504 arrives, the controller 130 one-shot programs, as indicated by the reference symbol PNM22, the second data DATA2 in the second normal block of the second memory device 1502.

While performing the one-shot program PNM22 for the second memory device 1502, the controller 130 erases the second data DATA2 from the cache buffer 1441.

Figure 12C:
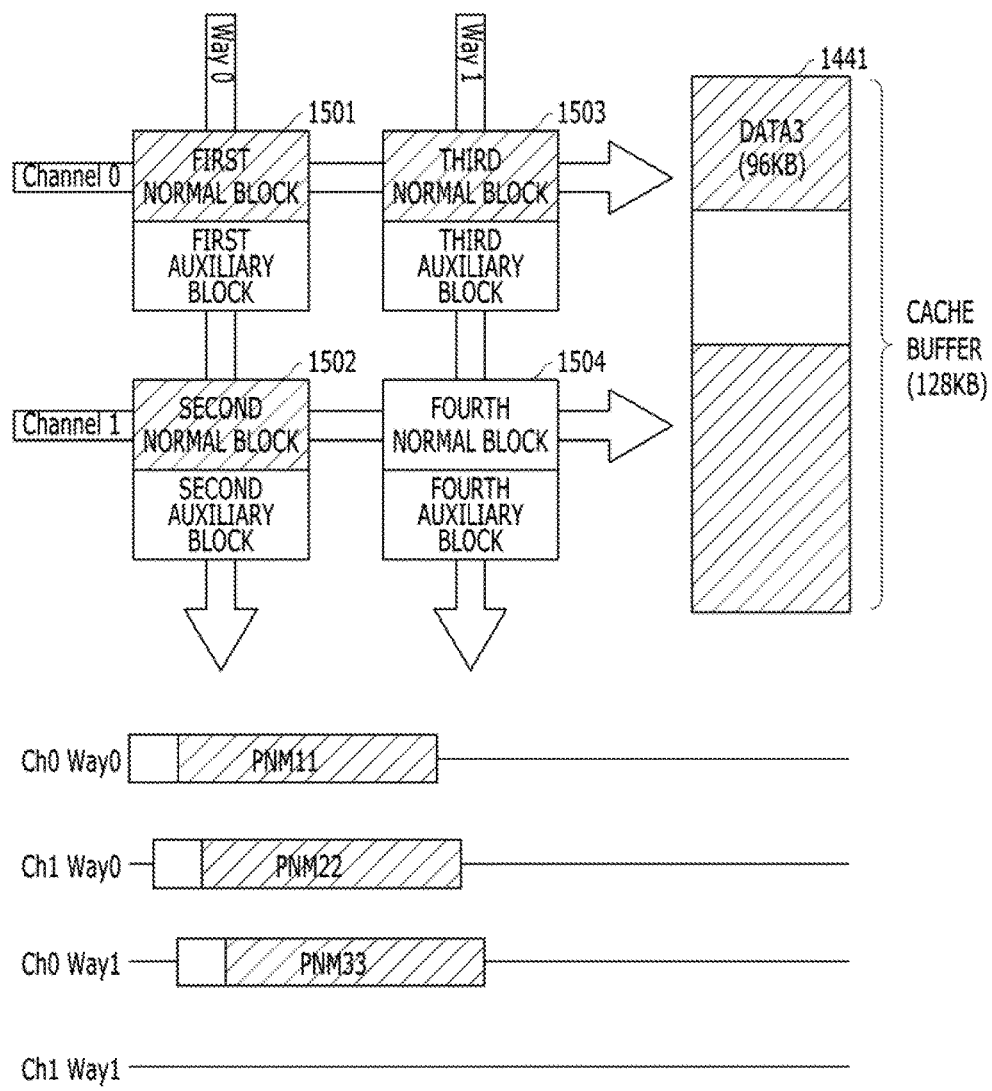

Referring to FIG. 12C, the controller 130 buffers third data DATA3, which is inputted from the host, in the cache buffer 1441. The controller 130 checks the used area of the cache buffer 1441 in which the third data DATA3 is buffered by taking the predetermined size of 96 KB as a reference. As a result, the third data DATA3 is buffered in the cache buffer 1441 and the used area of the cache buffer 1441 is precisely the predetermined size of 96 KB. Accordingly, the controller 130 may one-shot program the third data DATA3 in any one normal block among the respective normal blocks of the plurality of memory devices 1501, 1502, 1503 and 1504.

As shown in the drawings, among the plurality of memory devices 1501, 1502, 1503 and 1504, the first and second memory devices 1501 and 1502 are in a state in which they perform the operations PNM11 and PNM22 of one-shot programming the first and second data DATA1 and DATA2 in the first and second normal blocks, and the remaining third and fourth memory devices 1503 and 1504 are in a state in which they do not perform any operation. Therefore, according to the operation sequence by the interleaving scheme, when a time for the third memory device 1503 to operate among the plurality of memory devices 1501, 1502, 1503 and 1504 arrives, the controller 130 one-shot programs, as indicated by the reference symbol PNM33, the third data DATA3 in the third normal block of the third memory device 1503.

While performing the one-shot program PNM33 for the third memory device 1503, the controller 130 erases the third data DATA3 from the cache buffer 1441.

Figure 12D:
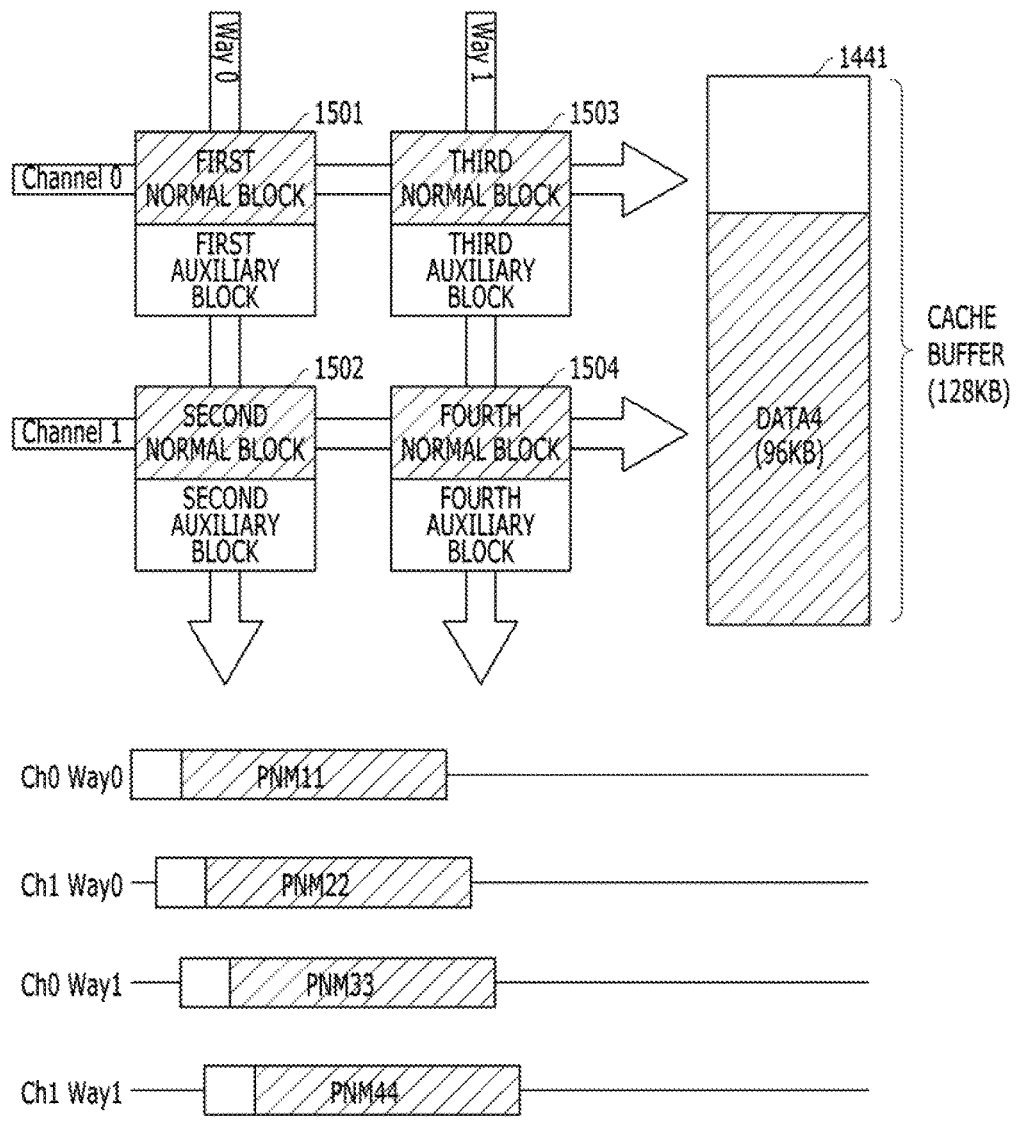

Referring to FIG. 12D, the controller 130 buffers fourth data DATA4 which is inputted from the host in the cache buffer 1441.

The controller 130 checks the used area of the cache buffer 1441 in which the fourth data DATA4 is buffered by taking the predetermined size of 96 KB as a reference. As a result, the fourth data DATA4 is buffered in the cache buffer 1441 and the used area of the cache buffer 1441 is precisely the predetermined size of 96 KB. Accordingly, the controller 130 may one-shot program the fourth data DATA4 in any one normal block among the respective normal blocks of the plurality of memory devices 1501, 1502, 1503 and 1504.

As shown in the drawings, among the plurality of memory devices 1501, 1502, 1503 and 1504, the first to third memory devices 1501, 1502 and 1503 are in a state in which they perform the operations PNM11, PNM22 and PNM33 of respectively one-shot programming the first to third data DATA1, DATA2 and DATA3 in the first to third normal blocks, and the remaining fourth memory device 1504 is in a state in which it does not perform any operation. Therefore, according to the operation sequence by the interleaving scheme, when a time for the fourth memory device 1504 to operate among the plurality of memory devices 1501, 1502, 1503 and 1504 arrives, the controller 130 one-shot programs, as indicated by the reference symbol PNM44, the fourth data DATA4 in the fourth normal block of the fourth memory device 1504.

While performing the one-shot program PNM44 for the fourth memory device 1504, the controller 130 erases the fourth data DATA4 from the cache buffer 1441.

In summary, the controller 130 operates the plurality of memory devices 1501, 1502, 1503 and 1504 in the interleaving scheme. Additionally, the controller 130 checks the used area of the cache buffer 1441 when each of the plurality of data DATA<1:4>, which is inputted sequentially, is buffered in the cache buffer 1441. As a result of checking, when the used area of the cache buffer 1441 is the predetermined size, the data DATA1, DATA2, DATA3 or DATA4 of the predetermined size which is buffered in the cache buffer 1441 is one-shot programmed in any one normal block among the respective normal blocks of the plurality of memory devices 1501, 1502, 1503 and 1504. Which memory device operated among the plurality of memory devices 1501, 1502, 1503 and 1504 is determined according to the operation sequence by the interleaving scheme. While one-shot programming the data DATA1, DATA2, DATA3 or DATA4 of the predetermined size in any one normal block among the respective normal blocks of the plurality of memory devices 1501, 1502, 1503 and 1504, the controller 130 erases the data DATA1, DATA2, DATA3 or DATA4 of the predetermined size from the cache buffer 1441.

For reference, FIGS. 12A to 12D illustrate that the first to fourth data DATA<1:4> are stored in the cache buffer 1441 in different forms. When the total size of the cache buffer 1441 is 128 KB and is thus larger than 96 KB as the predetermined size, the first to fourth data DATA<1:4> inputted successively are buffered in a FIFO (first-in first-out) policy. Such operation of the cache buffer 1441 is not limited thereto, and the cache buffer 1441 may perform another operation.

Figure 12E:
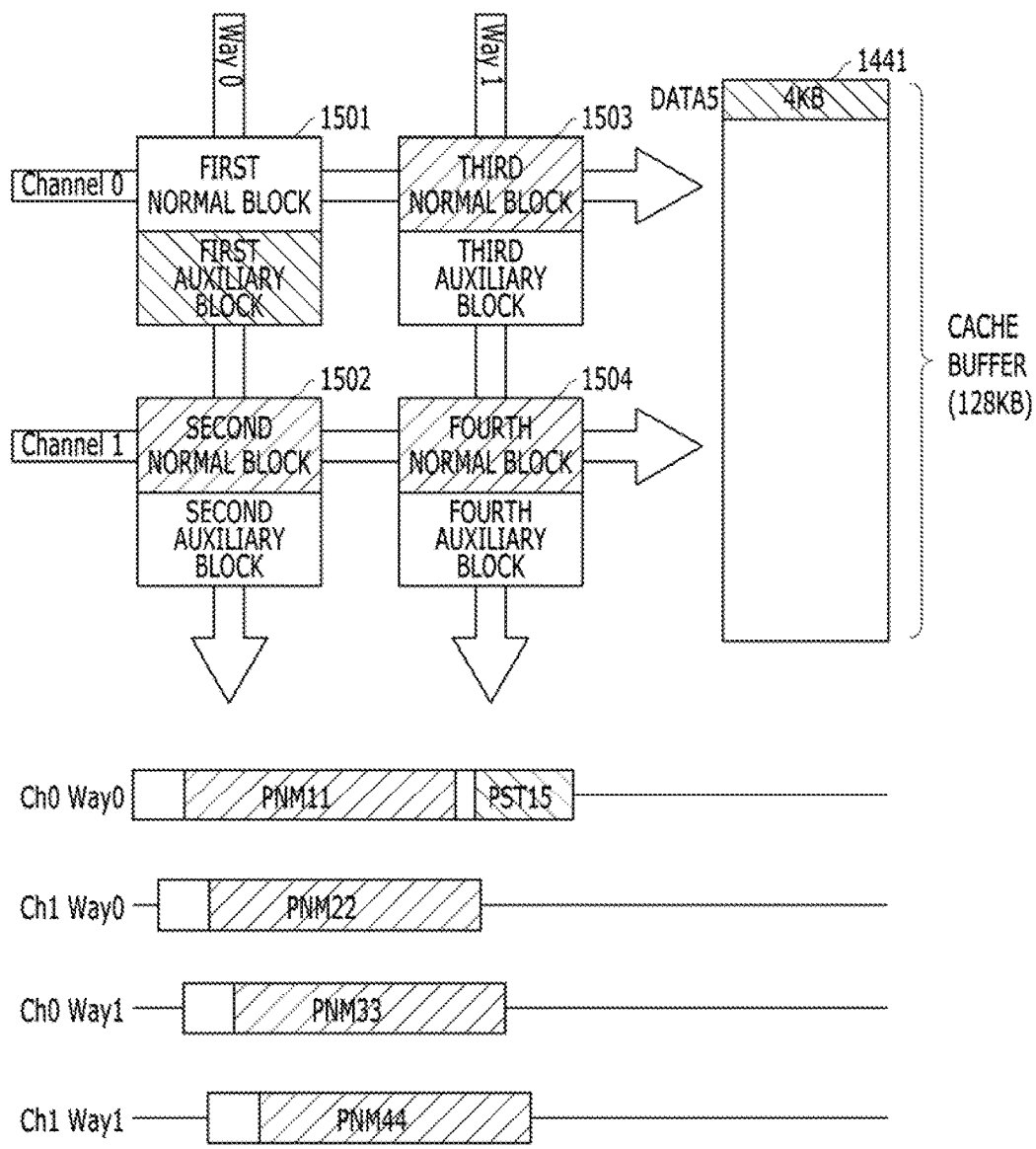

Referring to FIGS. 12E to 123J, the controller 130 controls the plurality of respective memory devices 1501, 1502, 1503 and 1504 when data smaller than the predetermined size, that is, data having a size smaller than 96 KB, is inputted from the host.

Referring to FIG. 12E, the controller 130 buffers fifth data DATA5, which is inputted from the host, in the cache buffer 1441.

The controller 130 checks the used area of the cache buffer 1441 in which the fifth data DATA5 is buffered by taking the predetermined size of 96 KB as a reference. As a result, the fifth data DATA5 is buffered in the cache buffer 1441 and the used area of the cache buffer 1441 becomes 4 KB. That is, it may be checked that the used area of the cache buffer 1441 in which the fifth data DATA5 is buffered is smaller than 96 KB as the predetermined size.

Accordingly, the controller 130 programs, as indicated by the reference symbol PST15, the fifth data DATA5 in any one auxiliary block among the respective auxiliary blocks of the plurality of memory devices 1501, 1502, 1503 and 1504. That is, since the fifth data DATA5 has a size smaller than the predetermined size, the controller 130 programs the fifth data DATA5 in an auxiliary block, instead of one-shot programming the fifth data DATA5 in any one normal block among the respective normal blocks of the plurality of memory devices 1501, 1502, 1503 and 1504.

The reason why the controller 130 programs the fifth data DATA5 in an auxiliary block instead of one-shot programming the fifth data DATA5 in any one normal block among the respective normal blocks of the plurality of memory devices 1501, 1502, 1503 and 1504 is that it is necessary to supplement dummy data when the data size is smaller than the predetermined size.

The data having a smaller size than the predetermined size cannot be stored in multilevel cells through the one-shot program operation due to the characteristic of the one-shot program operation. For example, in order to one-shot program the fifth data DATA5 of the size of 4 KB, which is smaller than 96 KB as the predetermined size, in any one normal block among the respective normal blocks of the plurality of memory devices 1501, 1502, 1503 and 1504, dummy data of 92 KB is needed.

In this regard, since it is possible to program the fifth data DATA5 in any one auxiliary block among the respective auxiliary blocks of the plurality of memory devices 1501, 1502, 1503 and 1504 through not the one-shot program operation but a conventional general program operation, it is not necessary to intentionally supplement dummy data.

The fifth data DATA5 is buffered in the cache buffer 1441 when the one-shot program operation of the first memory device 1501 which is first subject to the one-shot program operation is completed. The one-shot program operations of the remaining second to fourth memory devices 1502, 1503 and 1504 are not completed. That is, The fifth data DATA5 is buffered in the cache buffer 1441 after the operations of one-shot programming the first to fourth data DATA<1:4> in the respective normal blocks of the first to fourth memory devices 1501, 1502, 1503 and 1504 are started, as described above with reference to FIGS. 12A to 12D.

Accordingly, the controller 130 programs, as indicated by the reference symbol PST15, the fifth data DATA5 in the first auxiliary block of the first memory device 1501 among the plurality of memory devices 1501, 1502, 1503 and 1504 according to the operation sequence by the interleaving scheme.

The controller 130 programs, as indicated by the reference symbol PST15, the fifth data DATA5 sequentially in an empty space of the first auxiliary block included in the first memory device 1501. The location of the empty space is designated by the first storage location information (not shown) stored in the address management region. Then, the controller 130 updates the first storage location information and stores the updated first storage location information in the address management region.

The first storage location information which is updated in its value and is stored in the address management region is stored in the normal block of any one memory device which performs the program operation according to the operation sequence by the interleaving scheme among the second to fourth memory devices 1502, 1503 and 1504 excluding the first memory device 1501. For example, although not directly shown in the drawings, the operation of one-shot programming the data of the cache buffer 1441 in the second normal block of the second memory device 1502 is performed after the operation of programming the first auxiliary block of the first memory device 1501. The first storage location information is stored together in the second normal block when one-shot programming data of the cache buffer 1441 in the second normal block of the second memory device 1502. The reason why the first storage location information may be stored in the second normal block together with data of the cache buffer 1441 is that the first storage location information is stored in a spare region of the second normal block.

For reference, when the fifth data DATA5 is stored in the first auxiliary block of the first memory device 1501, the first storage location information may be used. In this regard, the second storage location information may be used in the case where the fifth data DATA5 is stored in the second auxiliary block of the second memory device 1502, the third storage location information may be used in the case where the fifth data DATA5 is stored in the third auxiliary block of the third memory device 1503, and the fourth storage location information may be used in the case where the fifth data DATA5 is stored in the fourth auxiliary block of the fourth memory device 1504.

Unlike in the program designated by the reference symbol PST15 for the first memory device 1501, the controller 130 does not erase the fifth data DATA5 from the cache buffer 1441.

The fifth data DATA5 which is buffered in the cache buffer 1441 is in a state in which it is programmed in the first auxiliary block of the first memory device 1501 and is not erased from the cache buffer 1441. In this case, data which is iteratively stored in any one auxiliary block among the respective auxiliary blocks of the plurality of memory devices 1501, 1502, 1503 and 1504 and in the cache buffer 1441 is managed as a valid state in any one auxiliary block among the respective auxiliary blocks of the plurality of memory devices 1501, 1502, 1503 and 1504.

Figure 12F:
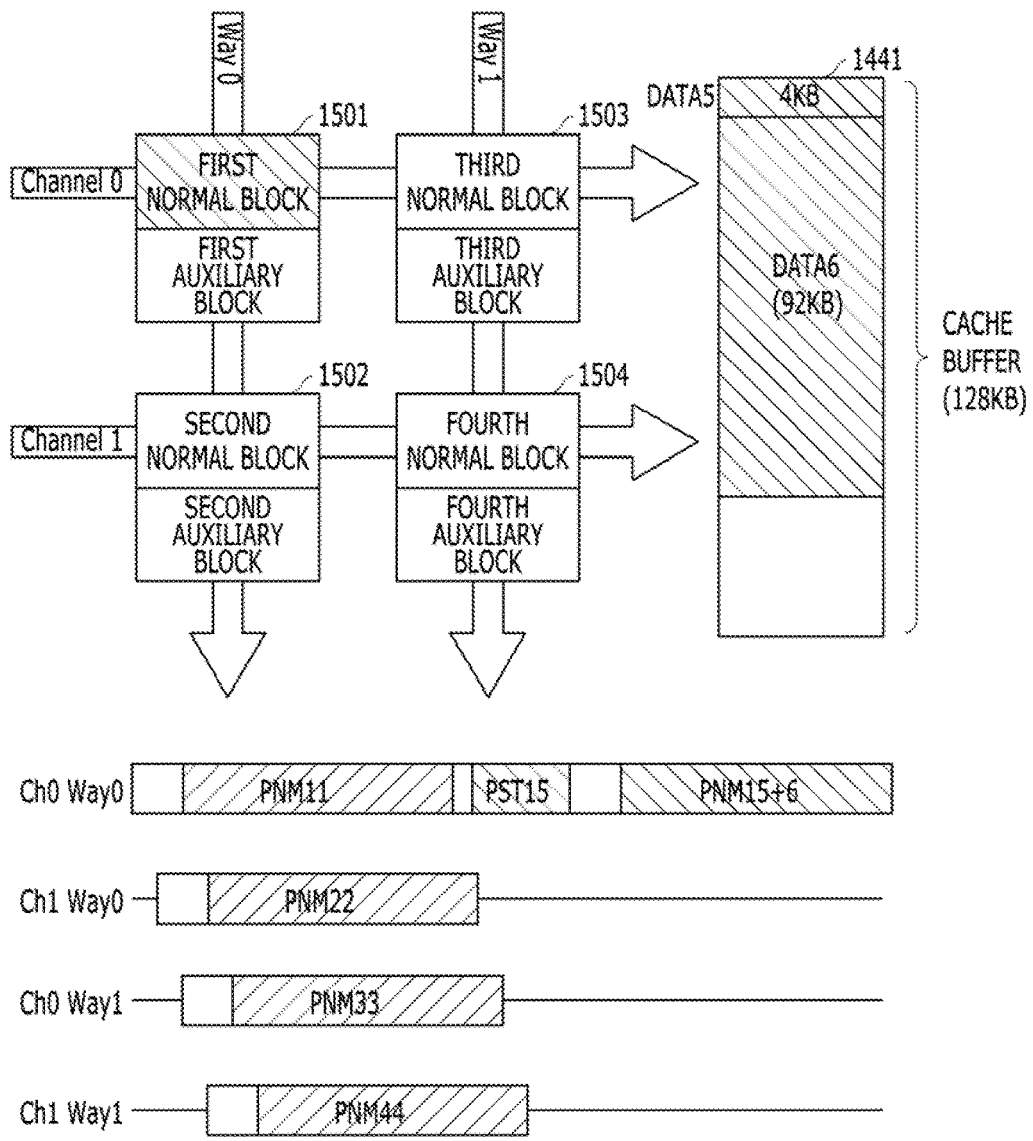

Referring to FIG. 12F, the controller 130 buffers sixth data DATA6 inputted from the host in the cache buffer 1441. The controller 130 checks the used area of the cache buffer 1441 in which the sixth data DATA6 is buffered by taking the predetermined size of 96 KB as a reference. As a result, it may be checked that a combined size of the fifth data DATA5 and the sixth data DATA6 used area is 96 KB.

Namely, the controller 130 does not erase the fifth data DATA5 from the cache buffer 1441 as described above with reference to FIG. 12E, and cumulatively buffers the subsequently inputted sixth data DATA6 together with the unerased fifth data DATA5 in the cache buffer 1441. As a result, the used area of the cache buffer 1441, in which the fifth data DATA5 and the sixth data DATA6 are cumulatively buffered, becomes 96 KB as the predetermined size.

Accordingly, the controller 130 may one-shot program the combined data, which is obtained by cumulatively adding the fifth data DATA5 and the sixth data DATA6, in any one normal block among the respective normal blocks of the plurality of memory devices 1501, 1502, 1503 and 1504.

The sixth data DATA6 is buffered in the cache buffer 1441 after the operation of programming the fifth data DATA5 in the first auxiliary block of the first memory device 1501 as described above with reference to FIG. 12E is completed. Further, the sixth data DATA6 is buffered in the cache buffer 1441 after the operations of one-shot programming the second to fourth data DATA<2:4> in the respective normal blocks of the second to fourth memory devices 1502, 1503 and 1504 as described above with reference to FIGS. 12B to 12D are completed. That is, the sixth data DATA6 is buffered in the cache buffer 1441 after all operations of the plurality of memory devices 1501, 1502, 1503 and 1504 are completed.

Therefore, according to the operation sequence by the interleaving scheme, when a time for the first memory device 1501 to operate among the plurality of memory devices 1501, 1502, 1503 and 1504 arrives, the controller 130 one-shot programs, as indicated by the reference symbol PNM15+6, the combined data obtained by cumulatively adding the fifth data DATA5 and the sixth data DATA6 buffered in the cache buffer 1441, in the first normal block of the first memory device 1501. The operation of one-shot programming the data, which is obtained by cumulatively adding the fifth data DATA5 and the sixth data DATA6 buffered in the cache buffer 1441, in the first normal block of the first memory device 1501, is an example of one embodiment. In another embodiment, the one-shot program may occur in a normal block of another memory device, rather than in the first normal block of the first memory device 1501. For example, when the operation sequence by the interleaving scheme is adjusted differently according to a designer's choice, as indicated by the reference symbol PNM15+6, the data obtained by cumulatively adding the fifth data DATA5 and the sixth data DATA6 buffered in the cache buffer 1441 may be one-shot programmed in any one normal block among the respective normal blocks of the second to fourth memory devices 1502, 1503 and 1504.

While performing the one-shot program PNM15+6 for the first memory device 1501, the controller 130 erases the data obtained by cumulatively adding the fifth data DATA5 and the sixth data DATA6 from the cache buffer 1441.

In this way, the fifth data DATA5, which has been buffered in the cache buffer 1441 while having the first auxiliary block of the first memory device 1501 programmed, is erased from the cache buffer 1441 as the fifth data DATA5 and the sixth data DATA6 are programmed together in the first normal block of the first memory device 1501. That is, when data is erased from the cache buffer 1441 and it is programmed in any one normal block among the respective normal blocks of the plurality of memory devices 1501, 1502, 1503 and 1504 after being programmed in any one auxiliary block among the respective auxiliary blocks of the plurality of memory devices 1501, 1502, 1503 and 1504, the data is managed as an invalid state in any one auxiliary block among the respective auxiliary blocks of the plurality of memory devices 1501, 1502, 1503 and 1504 if the data still remains in any one auxiliary block. That is, if the data is stored both in any one auxiliary block and in any one normal block of the plurality of memory devices 1501, 1502, 1503 and 1504, the data is treated as invalid.

In summary, the controller 130 operates the plurality of memory devices 1501, 1502, 1503 and 1504 in the interleaving scheme. Also, the controller 130 checks the used area of the cache buffer 1441 when each of the plurality of data DATA<1:4> inputted sequentially is buffered in the cache buffer 1441. As a result of checking, in the case where the used area of the cache buffer 1441 is smaller than the predetermined size, the data DATA5, which is buffered in the cache buffer 1441 and is smaller than the predetermined size, is programmed in any one auxiliary block among the respective auxiliary blocks of the plurality of memory devices 1501, 1502, 1503 and 1504. Which memory device is to be operated among the plurality of memory devices 1501, 1502, 1503 and 1504 is determined according to an operation sequence by the interleaving scheme. While programming the data DATA5 of a size smaller than the predetermined size in any one auxiliary block among the respective auxiliary blocks of the plurality of memory devices 1501, 1502, 1503 and 1504, the controller 130 does not erase the data DATA5 which is buffered in the cache buffer 1441 and has the size smaller than the predetermined size.

The data DATA5 which is smaller than the predetermined size is not erased from the cache buffer 1441 even after it is programmed in any one auxiliary block among the respective auxiliary blocks of the plurality of memory devices 1501, 1502, 1503 and 1504. Thus, the data DATA5 is cumulatively buffered in the cache buffer 1441 together with the subsequently inputted data DATA6. When buffering of the subsequently inputted data DATA6 is completed, the used area of the cache buffer 1441 is checked again. When the size of the data DATA5+DATA6 buffered in the cache buffer 1441 becomes the predetermined size, the data DATA5+DATA6, which is buffered in the cache buffer 1441, is one-shot programmed in any one normal block among the respective normal blocks of the plurality of memory devices 1501, 1502, 1503 and 1504.

While one-shot programming the data DATA5+DATA6, which is buffered in the cache buffer 1441 and has the predetermined size, in any one normal block among the respective normal blocks of the plurality of memory devices 1501, 1502, 1503 and 1504, the controller 130 erases the data DATA5+DATA6 from the cache buffer 1441.

Figure 12G:
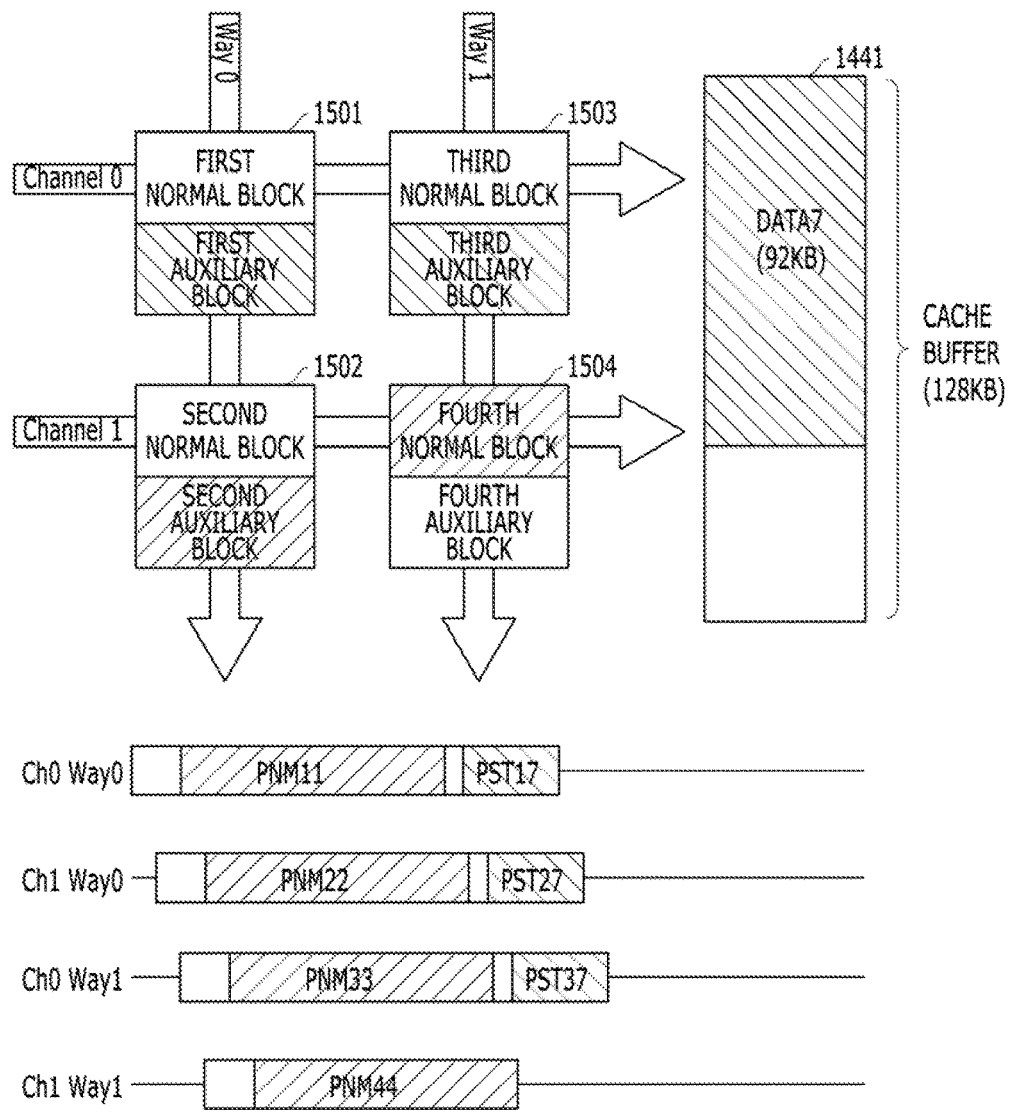

Referring to FIG. 12G, the controller 130 buffers seventh data DATA7 which is inputted from the host in the cache buffer 1441.

The controller 130 checks the used area of the cache buffer 1441 in which the seventh data DATA7 is buffered by taking the predetermined size of 96 KB as a reference. As a result, it may be checked that the seventh data DATA7 is buffered in the cache buffer 1441 and the used area of the cache buffer 1441 becomes 92 KB. That is, it may be checked that the used area of the cache buffer 1441 in which the seventh data DATA7 is buffered is 92 KB which is smaller than 96 KB as the predetermined size.

Therefore, although the controller 130 should program the seventh data DATA7 by selecting any one auxiliary block among the respective auxiliary blocks of the plurality of memory devices 1501, 1502, 1503 and 1504 as described above with reference to FIG. 12E, the size of the seventh data DATA7 is not a size suitable for being programmed in any one auxiliary block among the respective auxiliary blocks of the plurality of memory devices 1501, 1502, 1503 and 1504.

That is, since each of the respective auxiliary blocks of the plurality of memory devices 1501, 1502, 1503 and 1504 adopts a scheme of storing data through single-level cells, its capacity for storing data through one program operation is small.

For example, when the predetermined size for one-shot program is 96 KB, the memory cells included in each of the normal blocks of the plurality of memory devices 1501, 1502, 1503 and 1504 may be triple level cells. Since the memory cell included in each of the auxiliary blocks of the plurality of memory devices 1501, 1502, 1503 and 1504 is a single-level cell, its maximum size may be 32 KB, which is obtained by dividing 96 KB by 3.

For the seventh data DATA7 having the size of 92 KB to be programed by selecting any one auxiliary block among the respective auxiliary blocks of the plurality of memory devices 1501, 1502, 1503 and 1504, it is necessary to perform successively 3 program operations for the selected auxiliary block. This is inefficient.

Therefore, the controller 130 uses a scheme that, instead of selecting a single auxiliary block among the respective auxiliary blocks of the plurality of memory devices 1501, 1502, 1503 and 1504, a plurality of auxiliary blocks are selected according to the operation sequence by the interleaving scheme. The seventh data DATA7 is divisionally programmed, as indicated by the reference symbols PST17, PST27 and PST37, in the plurality of auxiliary blocks which are selected according to the operation sequence by the interleaving scheme.

For example, as shown in the drawings, the controller 130 sequentially selects the first auxiliary block, the second auxiliary block and the third auxiliary block among the respective auxiliary blocks of the plurality of memory devices 1501, 1502, 1503 and 1504 according to the operation sequence by the interleaving scheme, and divides, as indicated by the reference symbols PST17, PST27 and PST37, the seventh data DATA7 having the size of 92 KB into three data 32 KB, 32 KB and 28 KB and programs the three divided data 32 KB, 32 KB and 28 KB into the first auxiliary block, the second auxiliary block and the third auxiliary block, respectively.

The seventh data DATA7 is buffered in the cache buffer 1441 when the one-shot program operation of the first memory device 1501, which has first started the one-shot program operation, is completed and the one-shot program operations of the remaining second to fourth memory devices 1502, 1503 and 1504 are not completed. That is, the seventh data DATA7 is buffered in the cache buffer 1441 after the operations of one-shot programming the first to fourth data DATA<1:4> in the respective normal blocks of the first to fourth memory devices 1501, 1502, 1503 and 1504 are started as described above with reference to FIGS. 12A to 12D.

Accordingly, the controller 130 programs, as indicated by the reference symbol PST17, the front 32 KB of the seventh data DATA7, in the first auxiliary block of the first memory device 1501 among the plurality of memory devices 1501, 1502, 1503 and 1504, according to the operation sequence by the interleaving scheme. The controller 130 programs, as indicated by the reference symbol PST17, the front 32 KB of the seventh data DATA7 sequentially in an empty space of the first auxiliary block included in the first memory device 1501 which is designated by the first storage location information (not shown) stored in the address management region. Then, the controller 130 updates the first storage location information and stores the updated first storage location information in the address management region.

Successively, when the one-shot program operation of the second memory device 1502 is completed and the one-shot program operations of the third and fourth memory devices 1503 and 1504 are not completed, the controller 130 programs, as indicated by the reference symbol PST27, the middle 32 KB of the seventh data DATA7, in the second auxiliary block of the second memory device 1502 among the plurality of memory devices 1501, 1502, 1503 and 1504, according to the operation sequence by the interleaving scheme. The controller 130 programs, as indicated by the reference symbol PST27, the middle 32 KB of the seventh data DATA7 sequentially in an empty space of the second auxiliary block included in the second memory device 1502 which is designated by the second storage location information (not shown) stored in the address management region. Then, the controller 130 updates the second storage location information and stores the updated second storage location information in the address management region.

In succession, at a time when the one-shot program operation of the third memory device 1503 is completed and the one-shot program operation of the fourth memory device 1504 is not completed, the controller 130 programs, as indicated by the reference symbol PST37, the last 28 KB of the seventh data DATA7 in the third auxiliary block of the third memory device 1503 among the plurality of memory devices 1501, 1502, 1503 and 1504 according to the operation sequence by the Interleaving scheme. The controller 130 programs, as indicated by the reference symbol PST37, the last 28 KB of the seventh data DATA7 sequentially in an empty space of the third auxiliary block included in the third memory device 1503 by referring to the third storage location information (not shown) stored in the address management region. Then, the controller 130 updates the third storage location information and stores the updated third storage location information in the address management region.

The first to third storage location information, which are stored in the address management region and updated as described above, may be stored in the fourth normal block of the fourth memory device 1504 which operates after the first to third memory devices 1501, 1502 and 1503. The operation of one-shot programming the data of the cache buffer 1441 in the fourth normal block of the fourth memory device 1504 is performed following the operations of programming the respective auxiliary blocks of the first to third memory devices 1501, 1502 and 1503. In another embodiment, the first to third storage location information is stored together in the fourth normal block when one-shot programming data of the cache buffer 1441 in the fourth normal block of the fourth memory device 1504. The first to third storage location information may be stored in the fourth normal block together with data of the cache buffer 1441 in this way since the first to third storage location information is stored in a spare region of the fourth normal block.

Separately from performing the program designated by the reference symbols PST17, PST27 and PST37 for the first memory device 1501, the second memory device 1502 and the third memory device 1503, respectively, the controller 130 does not erase the seventh data DATA7 which is buffered in the cache buffer 1441.

In this way, the seventh data DATA7 which is buffered in the cache buffer 1441 is programmed in the respective auxiliary blocks of the first to third memory devices 1501, 1502 and 1503 while not being erased from the cache buffer 1441. In this case, data iteratively stored in the respective auxiliary blocks of the plurality of memory devices 1501, 1502, 1503 and 1504 and in the cache buffer 1441 is managed as a valid state in the respective auxiliary blocks of the plurality of memory devices 1501, 1502, 1503 and 1504.

Figure 12H:
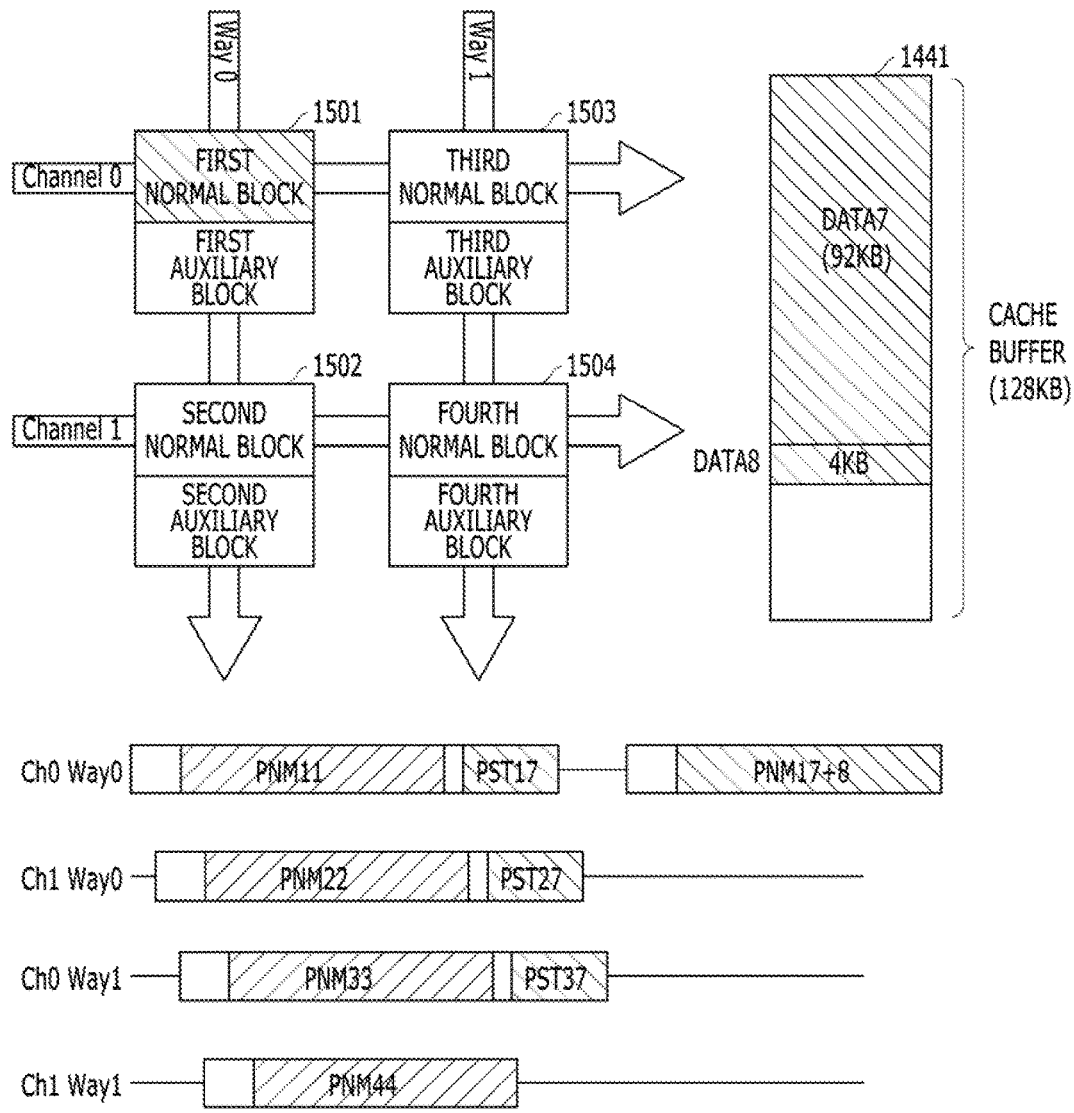

Referring to FIG. 12H, the controller 130 buffers eighth data DATA8 in the cache buffer 1441. The eighth data DATA8 is inputted from the host. The controller 130 checks the used area of the cache buffer 1441 allotted to buffer the eighth data DATA8 by taking the predetermined size of 96 KB as a reference. As a result, the seventh data DATA7 and the eighth data DATA8 are cumulatively buffered in the cache buffer 1441 and the used area of the cache buffer 1441 becomes 96 KB.

Namely, the controller 130 does not erase the seventh data DATA7 from the cache buffer 1441 as described above with reference to FIG. 12G, and cumulatively buffers the subsequently inputted eighth data DATA8 together with the unerased seventh data DATA7 in the cache buffer 1441. As a result, the used area of the cache buffer 1441, in which the seventh data DATA7 and the eighth data DATA8 are cumulatively buffered, becomes 96 KB which is the same as the predetermined size.

Accordingly, the controller 130 may one-shot program the data, which is obtained by cumulatively adding the seventh data DATA7 and the eighth data DATA8, in any one normal block among the respective normal blocks of the plurality of memory devices 1501, 1502, 1503 and 1504.

The eighth data DATA8 is buffered in the cache buffer 1441 after the operations of programming the seventh data DATA7 in the respective auxiliary blocks of the first to third memory devices 1501, 1502 and 1503 as described above with reference to FIG. 12G are completed. Further, the eighth data DATA8 is buffered in the cache buffer 1441 after the operation of one-shot programming the fourth data DATA4 in the fourth normal block of the fourth memory device 1504 as described above with reference to FIG. 12D is completed. That is, the eighth data DATA8 is buffered in the cache buffer 1441 after all operations of the plurality of memory devices 1501, 1502, 1503 and 1504 are completed.

Therefore, according to the operation sequence by the interleaving scheme, it is a turn for the first memory device 1501 to operate among the plurality of memory devices 1501, 1502, 1503 and 1504, the controller 130 one-shot programs, as indicated by the reference symbol PNM17+8, the data obtained by cumulatively adding the seventh data DATA7 and the eighth data DATA8 buffered in the cache buffer 1441, in the first normal block of the first memory device 1501.

Of course, one-shot programming the data obtained by cumulatively adding the seventh data DATA7 and the eighth data DATA8 buffered in the cache buffer 1441 in the first normal block of the first memory device 1501 is a mere example. In the case where the operation sequence by the interleaving scheme is differently adjusted according to a designer's choice, it is possible to one-shot program the data obtained by cumulatively adding the seventh data DATA7 and the eighth data DATA8 buffered in the cache buffer 1441 in any one normal block among the respective normal blocks of the second to fourth memory devices 1502, 1503 and 1504.

While performing the one-shot program PNM17+8 for the first memory device 1501, the controller 130 erases the data obtained by cumulatively adding the seventh data DATA7 and the eighth data DATA8 buffered in the cache buffer 1441.

In this way, the seventh data DATA7, which has been buffered in the cache buffer 1441 while having been programmed in the respective auxiliary blocks of the first to third memory devices 1501, 1502 and 1503, is erased from the cache buffer 1441 as the seventh data DATA7 and the eighth data DATA8 are programmed together in the first normal block of the first memory device 1501. In this case, data is erased from the cache buffer 1441 as it is programmed in any one normal block among the respective normal blocks of the plurality of memory devices 1501, 1502, 1503 and 1504. The data iteratively programmed in at least one auxiliary block and any one normal block among the respective auxiliary blocks and the respective normal blocks of the plurality of memory devices 1501, 1502, 1503 and 1504 is managed as an invalid state in at least one auxiliary block among the respective auxiliary blocks of the plurality of memory devices 1501, 1502, 1503 and 1504.

In summary, the controller 130 operates the plurality of memory devices 1501, 1502, 1503 and 1504 in the interleaving scheme. Also, the controller 130 checks the used area of the cache buffer 1441 at each time of buffering each of the plurality of data DATA<1:4>, which is inputted sequentially, in the cache buffer 1441. Upon checking, when the used area of the cache buffer 1441 is smaller than the predetermined size but is larger than a size capable of being programmed in each of the respective auxiliary blocks of the plurality of memory devices 1501, 1502, 1503 and 1504 through one program operation, a plurality of auxiliary blocks are selected among the respective auxiliary blocks of the plurality of memory devices 1501, 1502, 1503 and 1504 according to the operation sequence by the Interleaving scheme. Then, the data DATA7 which is buffered in the cache buffer 1441 and has a size smaller than the predetermined size is divided into multiple fragments and programmed sequentially as indicated by the reference symbols PST17, PST27 and PST37.

Which memory device is to be operated among the plurality of memory devices 1501, 1502, 1503 and 1504 is determined according to the operation sequence by the Interleaving scheme. While programming the data DATA7 whose size is smaller than the predetermined size in one or more auxiliary blocks among the respective auxiliary blocks of the plurality of memory devices 1501, 1502, 1503 and 1504, the controller 130 does not erase the data DATA7 which is buffered in the cache buffer 1441 and has the size smaller than the predetermined size.

In this way, since the data DATA7 which has a smaller size than the predetermined size is not erased from the cache buffer 1441 even after it is programmed in one or more auxiliary blocks which is selected among the respective auxiliary blocks of the plurality of memory devices 1501, 1502, 1503 and 1504, the data DATA7 is cumulatively buffered in the cache buffer 1441 together with the subsequently inputted data DATA8. At a time when buffering of the subsequently inputted data DATA8 is completed, the used area of the cache buffer 1441 is checked again. When the size of the data DATA7+DATA8 buffered in the cache buffer 1441 becomes the predetermined size, the data DATA7+DATA8, which is buffered in the cache buffer 1441 and has the predetermined size, is subject to a one-shot program in any one normal block which is selected among the respective normal blocks of the plurality of memory devices 1501, 1502, 1503 and 1504.

While one-shot programming the data DATA7+DATA8 which is buffered in the cache buffer 1441 and has the predetermined size in any one normal block among the respective normal blocks of the plurality of memory devices 1501, 1502, 1503 and 1504, the controller 130 erases the data DATA7+DATA8 which is buffered in the cache buffer 1441 and has the predetermined size.

Figure 12I:
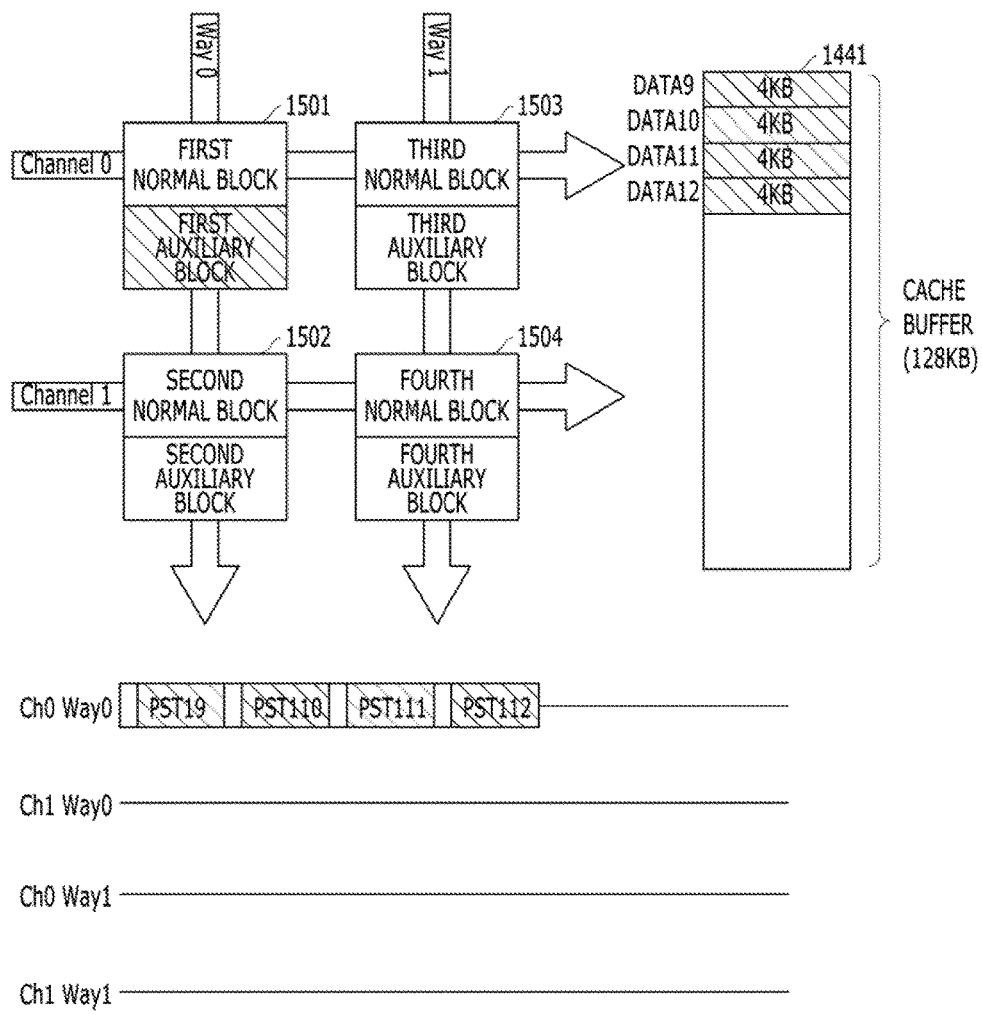

Referring to FIG. 12I, the controller 130 buffers ninth data DATA9 inputted from the host in the cache buffer 1441. The controller 130 checks the used area of the cache buffer 1441 in which the ninth data DATA9 is buffered by taking the predetermined size of 96 KB as a reference. As a result, it may be checked that the ninth data DATA9 is buffered in the cache buffer 1441 and the used area of the cache buffer 1441 becomes 4 KB. That is, it may be checked that the used area of the cache buffer 1441 in which the ninth data DATA9 is buffered is 4 KB and is smaller than 96 KB which is used as the predetermined size.

Accordingly, as described above with reference to FIG. 12E, the controller 130 programs, as indicated by the reference symbol PST19, the ninth data DATA9 in any one auxiliary block among the respective auxiliary blocks of the plurality of memory devices 1501, 1502, 1503 and 1504. Since the ninth data DATA9 has a size smaller than the predetermined size, the controller 130 programs the ninth data DATA9 in an auxiliary block, instead of one-shot programming the ninth data DATA9 in any one normal block among the respective normal blocks of the plurality of memory devices 1501, 1502, 1503 and 1504.

For example, the controller 130 programs, as indicated by the reference symbol PST19, the ninth data DATA9 in the first auxiliary block of the first memory device 1501 among, the plurality of memory devices 1501, 1502, 1503 and 1504, according to the operation sequence by the interleaving scheme.

The controller 130 programs, as indicated by the reference symbol PST19, the ninth data DATA9 sequentially in an empty space of the first auxiliary block included in the first memory device 1501 which is designated by the first storage location information (not shown) stored in the address management region. Then, the controller 130 updates the first storage location information and stores the updated first storage location information in the address management region.

While performing the program designated by the reference symbol PST19 for the first memory device 1501, the controller 130 does not erase the ninth data DATA9 which is buffered in the cache buffer 1441.

After programming the ninth data DATA9 in the first auxiliary block of the first memory device 1501 as described above, the controller 130 buffers tenth data DATA10, which is inputted from the host, in the cache buffer 1441.

The controller 130 checks the used area of the cache buffer 1441 in which the tenth data DATA10 is buffered by taking the predetermined size of 96 KB as a reference. As a result, it may be that the total size of the ninth data DATA9 and the tenth data DATA10 used area occupy in the cache buffer 1441 is 8 KB.

Namely, the controller 130 does not erase the ninth data DATA9 from the cache buffer 1441, and cumulatively buffers the subsequently inputted tenth data DATA10 together with the unerased ninth data DATA9 in the cache buffer 1441. Even though the ninth data DATA9 and the tenth data DATA10 are cumulatively buffered, the used area of the cache buffer 1441 is 8 KB which is still smaller than the predetermined size.

Accordingly, the controller 130 should program the data DATA9+DATA10 which is buffered in the cache buffer 1441 and is smaller than the predetermined size in any one auxiliary block among the respective auxiliary blocks of the plurality of memory devices 1501, 1502, 1503 and 1504. At this time, it is not necessary to program again the ninth data DATA9 which is completely programmed in the first auxiliary block of the first memory device 1501 before the tenth data DATA10 is inputted. Accordingly, the controller 130 programs, as indicated by the reference symbol PST110, the tenth data DATA10 only in any one auxiliary block among the respective auxiliary blocks of the plurality of memory devices 1501, 1502, 1503 and 1504. That is, when programming data, which is buffered in the cache buffer 1441 and is smaller than the predetermined size, in any one auxiliary block among the respective auxiliary blocks of the plurality of memory devices 1501, 1502, 1503 and 1504, only the data DATA10 which is most recently buffered is programmed.

The tenth data DATA10 is buffered in the cache buffer 1441 after the operation of programming the previously inputted ninth data DATA9 in the first auxiliary block of the first memory device 1501 is completed. Therefore, when selecting any one auxiliary block among the respective auxiliary blocks of the plurality of memory devices 1501, 1502, 1503 and 1504 to program the tenth data DATA10, the first auxiliary block of the first memory device 1501 is included in selection targets. In an embodiment, according to the operation sequence by the interleaving scheme, the first auxiliary block of the first memory device 1501 may be selected again.

For example, as shown in the drawing, the controller 130 programs, as indicated by the reference symbol PST110, the tenth data DATA10 in the first auxiliary block of the first memory device 1501 among the plurality of memory devices 1501, 1502, 1503 and 1504 according to the operation sequence by the interleaving scheme. As shown in the drawing, the tenth data DATA10 may be successively programmed again in the first auxiliary block of the first memory device 1501 after programming the ninth data DATA9 in the first auxiliary block of the first memory device 1501. However, the present invention is not limited thereto. In another embodiment, another operation is possible according to a designer's choice.

The controller 130 programs, as indicated by the reference symbol PST110, the tenth data DATA10 sequentially in an empty space of the first auxiliary block included in the first memory device 1501 which is designated by the first storage location information (not shown) stored in the address management region. Then, the controller 130 updates the first storage location information and stores the updated first storage location information in the address management region.

While performing the program designated by the reference symbol PST110 for the first memory device 1501, the controller 130 does not erase the tenth data DATA10 which is buffered in the cache buffer 1441. Accordingly, both the ninth data DATA9 and the tenth data DATA10 are not erased and remain in the cache buffer 1441.

After sequentially programming the ninth data DATA9 and the tenth data DATA10 in the first auxiliary block of the first memory device 1501 as described above, the controller 130 buffers eleventh data DATA11, which is inputted from the host, in the cache buffer 1441.

The controller 130 checks the used area of the cache buffer 1441 in which the eleventh data DATA11 is buffered by taking the predetermined size of 96 KB as a reference. As a result, it may be checked that the total size of the ninth data DATA9, the tenth data DATA10 and, the eleventh data DATA11 which occupies in the cache buffer 1441 is 12 KB.

That is, the controller 130 does not erase the ninth data DATA9 and the tenth data DATA10 from the cache buffer 1441, and cumulatively buffers the subsequently inputted eleventh data DATA11 together with the unerased ninth data DATA9 and tenth data DATA10 in the cache buffer 1441. Even though the ninth data DATA9, the tenth data DATA10, and the eleventh data DATA11 are cumulatively buffered, the total used area of the cache buffer 1441 becomes 12 KB and is still smaller than the predetermined size.

Accordingly, the controller 130 should program the data DATA9+DATA10+DATA11, which is buffered in the cache buffer 1441 and is still smaller than the predetermined size, in any one auxiliary block among the respective auxiliary blocks of the plurality of memory devices 1501, 1502, 1503 and 1504. At this time, it is not necessary to again program the ninth data DATA9 and the tenth data DATA10 since both were already completely programmed in the first auxiliary block of the first memory device 1501 before the eleventh data DATA11 is inputted. Accordingly, the controller 130 programs, as indicated by the reference symbol PST111, the eleventh data DATA11 in any one auxiliary block among the respective auxiliary blocks of the plurality of memory devices 1501, 1502, 1503 and 1504. That is, when programming data, which is buffered in the cache buffer 1441 and is smaller than the predetermined size, in any one auxiliary block among the respective auxiliary blocks of the plurality of memory devices 1501, 1502, 1503 and 1504, only the data DATA11 which is most recently buffered is programmed.

The eleventh data DATA11 is buffered in the cache buffer 1441 after the operation of programming the previously inputted tenth data DATA10 in the first auxiliary block of the first memory device 1501 is completed. Therefore, when selecting any one auxiliary block among the respective auxiliary blocks of the plurality of memory devices 1501, 1502, 1503 and 1504 to program the eleventh data DATA11, the first auxiliary block of the first memory device 1501 is included in selection targets. That is, the first auxiliary block of the first memory device 1501 is selected again.

As shown in the drawing, the controller 130 programs, as indicated by the reference symbol PST111, the eleventh data DATA11 in the first auxiliary block of the first memory device 1501 among the plurality of memory devices 1501, 1502, 1503 and 1504 according to the operation sequence by the interleaving scheme. As shown in the drawing, the operation of successively programming the eleventh data DATA11 again in the first auxiliary block of the first memory device 1501 after programming the ninth data DATA9 and the tenth data DATA10 in the first auxiliary block of the first memory device 1501 is one embodiment. However, the present invention is not limited thereto. Another operation is available according to a designer's choice.

The controller 130 programs, as indicated by the reference symbol PST111, the eleventh data DATA11 sequentially in an empty space of the first auxiliary block included in the first memory device 1501 which is designated by the first storage location information (not shown) stored in the address management region. Then, the controller 130 updates the first storage location information and stores the updated first storage location information in the address management region.

While performing the program designated by the reference symbol PST111 for the first memory device 1501, the controller 130 does not erase the eleventh data DATA11 which is buffered in the cache buffer 1441. Accordingly, all the ninth data DATA9, the tenth data DATA10, and the eleventh data DATA11 are not erased and remain in the cache buffer 1441.

After sequentially programming the ninth data DATA9, the tenth data DATA10, and the eleventh data DATA11 in the first auxiliary block of the first memory device 1501 as described above, the controller 130 buffers twelfth data DATA12, which is inputted from the host, in the cache buffer 1441.

The controller 130 checks the used area of the cache buffer 1441 in which the twelfth data DATA12 is buffered by taking the predetermined size of 96 KB as a reference. As a result, it may be checked that the total size of the ninth data DATA9, the tenth data DATA10, the eleventh data DATA11, and the twelfth data DATA12 which occupies the cache buffer 1441 is 16 KB.

The controller 130 does not erase the ninth data DATA9, the tenth data DATA10, and the eleventh data DATA11 from the cache buffer 1441, and cumulatively buffers the subsequently inputted twelfth data DATA12 together with the unerased ninth data DATA9, tenth data DATA10 and eleventh data DATA11 in the cache buffer 1441. Even though the ninth data DATA9, the tenth data DATA10, the eleventh data DATA11, and the twelfth data DATA12 are cumulatively buffered, the total used area of the cache buffer 1441 is 16 KB which is still smaller than the predetermined size.

Accordingly, the controller 130 should program the data DATA9+DATA10+DATA11+DATA12, which is buffered in the cache buffer 1441 and has a smaller size than the predetermined size, in any one auxiliary block among the respective auxiliary blocks of the plurality of memory devices 1501, 1502, 1503 and 1504. At this time, it is not necessary to again program the ninth data DATA9, the tenth data DATA10 and the eleventh data DATA11 since they were already completely programmed in the first auxiliary block of the first memory device 1501 before the twelfth data DATA12 is inputted. Accordingly, the controller 130 programs, as indicated by the reference symbol PST112, the twelfth data DATA12 in any one auxiliary block among the respective auxiliary blocks of the plurality of memory devices 1501, 1502, 1503 and 1504. That is, when programming data which is buffered in the cache buffer 1441 and has a smaller size than the predetermined size, in any one auxiliary block among the respective auxiliary blocks of the plurality of memory devices 1501, 1502, 1503 and 1504, only the data DATA12 which is most recently buffered is programmed.

The twelfth data DATA12 is buffered in the cache buffer 1441 after the operation of programming the previously inputted eleventh data DATA11 in the first auxiliary block of the first memory device 1501 is completed. Therefore, when selecting any one auxiliary block among the respective auxiliary blocks of the plurality of memory devices 1501, 1502, 1503 and 1504 to program the twelfth data DATA12, the first auxiliary block of the first memory device 1501 is included in selection targets. Thus, the first auxiliary block of the first memory device 1501 is selected again.

As shown in the drawing, the controller 130 programs, as indicated by the reference symbol PST112, the twelfth data DATA12 in the first auxiliary block of the first memory device 1501 among the plurality of memory devices 1501, 1502, 1503 and 1504 according to the operation sequence by the interleaving scheme. Of course, the present invention is not limited to the operation of, as shown in the drawing, successively programming the twelfth data DATA12 again in the first auxiliary block of the first memory device 1501 after programming the ninth data DATA9, the tenth data DATA10 and the eleventh data DATA11 in the first auxiliary block of the first memory device 1501. In another embodiment, another operation is available according to a designer's choice.

The controller 130 programs, as indicated by the reference symbol PST112, the twelfth data DATA12 sequentially in an empty space of the first auxiliary block included in the first memory device 1501 which is designated by the first storage location information (not shown) stored in the address management region. Then, the controller 130 updates the first storage location information and stores the updated first storage location information in the address management region.

The first storage location information, which is updated in its value and is stored in the address management region in this way, is stored in the normal block of any one memory device, according to the operation sequence by the interleaving scheme, among the second to fourth memory devices 1502, 1503 and 1504 excluding the first memory device 1501.

For example, the operation of one-shot programming the data of the cache buffer 1441 in the second normal block of the second memory device 1502 is performed following the operation of programming the first auxiliary block of the first memory device 1501, the first storage location information is stored together in the second normal block when one-shot programming data of the cache buffer 1441 in the second normal block of the second memory device 1502. The first storage location information may be stored in the second normal block together with data of the cache buffer

1441 in this way since the first storage location information is stored in a spare region of the second normal block.

While performing the program designated by the reference symbol PST112 for the first memory device 1501, the controller 130 does not erase the twelfth data DATA12 which is buffered in the cache buffer 1441. Accordingly, all the ninth data DATA9, the tenth data DATA10, the eleventh data DATA11, and the twelfth data DATA12 are not erased and remain in the cache buffer 1441.

In this way, the ninth data DATA9, the tenth data DATA10, the eleventh data DATA11 and the twelfth data DATA12, which are buffered in the cache buffer 1441, are programmed in the first auxiliary block of the first memory device 1501 while not being erased from the cache buffer 1441. In this case, data iteratively are stored in any one among the respective auxiliary blocks of the plurality of memory devices 1501, 1502, 1503 and 1504 and in the cache buffer 1441 and are managed as a valid state in any one among the respective auxiliary blocks of the plurality of memory devices 1501, 1502, 1503 and 1504.

Figure 12J:
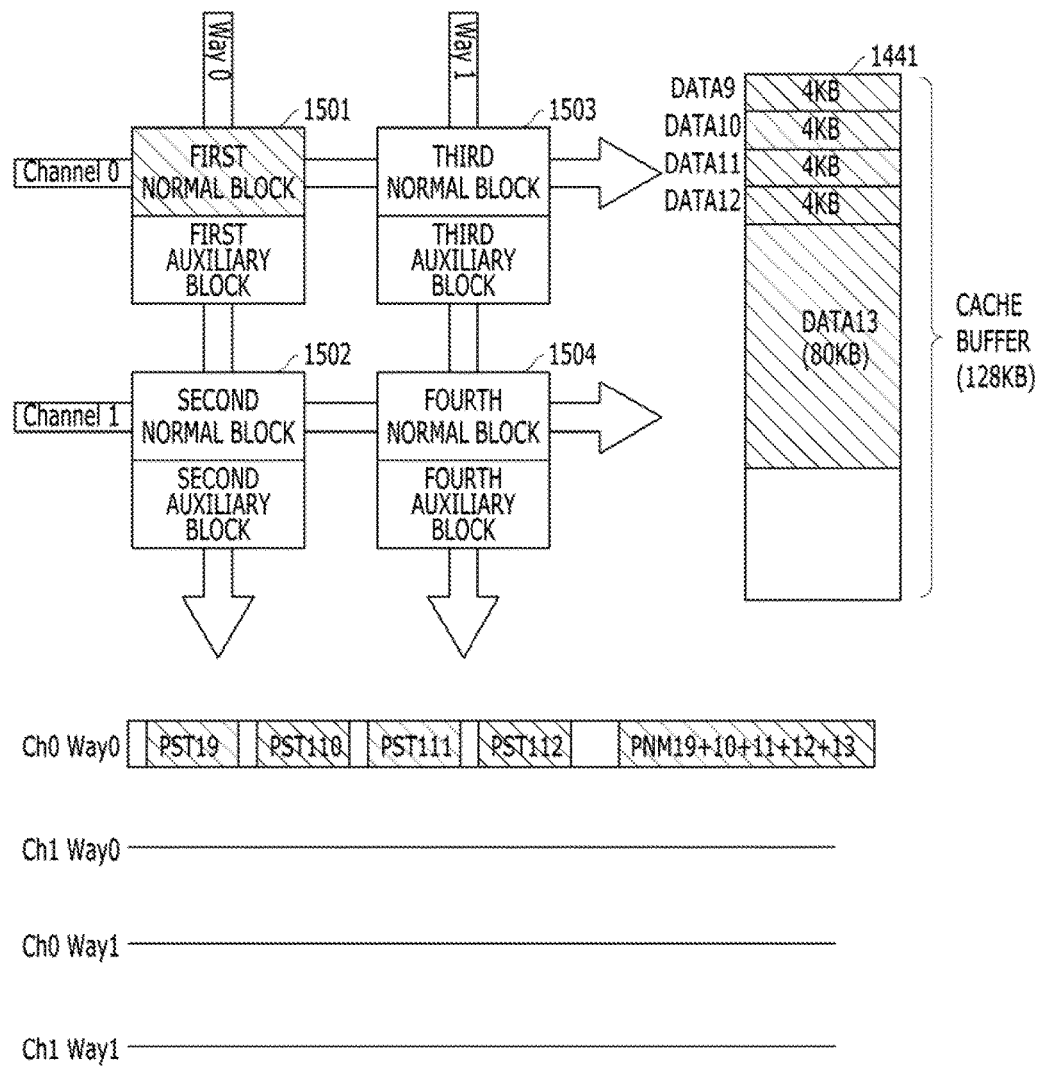

Referring to FIG. 12J, the controller 130 buffers thirteenth data DATA13, which is inputted from the host, in the cache buffer 1441.

The controller 130 checks the total used area of the cache buffer 1441, in which the thirteenth data DATA13 is buffered, by taking the predetermined size of 96 KB as a reference. As a result, it may be checked that the total size of the ninth data DATA9, the tenth data DATA10, the eleventh data DATA11, the twelfth data DATA12 and the thirteenth data DATA13, which are cumulatively buffered in the cache buffer 1441 and occupy the cache buffer 1441, is 96 KB.

The controller 130 does not erase the ninth data DATA9, the tenth data DATA10, the eleventh data DATA11 and the twelfth data DATA12 from the cache buffer 1441 as described above with reference to FIG. 12I. Instead, the controller 130 cumulatively buffers the subsequently inputted thirteenth data DATA13 together with the unerased ninth data DATA9, tenth data DATA10, eleventh data DATA11 and twelfth data DATA12 in the cache buffer 1441. The total used area of the cache buffer 1441 that the ninth data DATA9, the tenth data DATA10, the eleventh data DATA11, the twelfth data DATA12 and the thirteenth data DATA13 occupy may be 96 KB.

Accordingly, the controller 130 may one-shot program the data, which is obtained by cumulatively adding the ninth data DATA9, the tenth data DATA10, the eleventh data DATA11, the twelfth data DATA12 and the thirteenth data DATA13, in any one normal block among the respective normal blocks of the plurality of memory devices 1501, 1502, 1503 and 1504.

The thirteenth data DATA13 is buffered in the cache buffer 1441 after the operation of programming the twelfth data DATA12 in the first auxiliary block of the first memory device 1501 as described above with reference to FIG. 12I is completed. Therefore, when selecting any one normal block among the respective normal blocks of the plurality of memory devices 1501, 1502, 1503 and 1504 to program the ninth data DATA9, the tenth data DATA10, the eleventh data DATA11, the twelfth data DATA12 and the thirteenth data DATA13, the first normal block of the first memory device 1501 is included in selection targets. Thus, the first normal block of the first memory device 1501 may be selected again.

As shown in the drawing, the controller 130 one-shot programs, as indicated by the reference symbol PNM19+10+11+12+13, the data which is obtained by cumulatively adding the ninth data DATA9, the tenth data DATA10, the eleventh data DATA11, the twelfth data DATA12 and the thirteenth data DATA13 in the first normal block of the first memory device 1501 among the plurality of memory devices 1501, 1502, 1503 and 1504, according to the operation sequence by the interleaving scheme. Of course, the present invention is not limited to the operation of, as shown in the drawing, successively one-shot programming the data obtained by cumulatively adding the ninth data DATA9, the tenth data DATA10, the eleventh data DATA11, the twelfth data DATA12 and the thirteenth data DATA13 in the first normal block of the first memory device 1501 after programming the ninth data DATA9, the tenth data DATA10, the eleventh data DATA11 and the twelfth data DATA12 in the first auxiliary block of the first memory device 1501. In another embodiment, another operation is available according to a designer's choice.

While performing the one-shot program PNM19+10+11+12+13 for the first memory device 1501, the controller 130 erases the data, which is obtained by cumulatively adding the ninth data DATA9, the tenth data DATA10, the eleventh data DATA11, the twelfth data DATA12 and the thirteenth data DATA13, from the cache buffer 1441.

In this way, the ninth data DATA9, the tenth data DATA10, the eleventh data DATA11 and the twelfth data DATA12, which have been buffered in the cache buffer 1441 while having been programmed in the first auxiliary block of the first memory device 1501, are erased from the cache buffer 1441 when the ninth data DATA9, the tenth data DATA10, the eleventh data DATA11 and the twelfth data DATA12 are programmed together with the thirteenth data DATA13 in the first normal block of the first memory device 1501. When the data is erased from the cache buffer 1441 and programmed in any one normal block among the respective normal blocks of the plurality of memory devices 1501, 1502, 1503 and 1504 after being programmed in at least one auxiliary block among the respective auxiliary blocks of the plurality of memory devices 1501, 1502, 1503 and 1504, the data which is iteratively programmed in at least one auxiliary block and in any one normal block among the respective auxiliary blocks and the respective normal blocks of the plurality of memory devices 1501, 1502, 1503 and 1504 is managed as an invalid state in at least one auxiliary block among the respective auxiliary blocks of the plurality of memory devices 1501, 1502, 1503 and 1504.

In summary, the controller 130 operates the plurality of memory devices 1501, 1502, 1503 and 1504 in the interleaving scheme. Also, the controller 130 checks the used area of the cache buffer 1441 at each time of buffering each of the plurality of data DATA<9:13>, which is inputted sequentially, in the cache buffer 1441. When the total used area of the cache buffer 1441 which is occupied by DATA9, DATA9+DATA10, DATA9+DATA10+DATA11 or DATA9+DATA10+DATA11+DATA12 is smaller than the predetermined size, the data DATA9, DATA9+DATA10, DATA9+DATA10+DATA11 or DATA9+DATA10+DATA11+DATA12 is programmed in any one auxiliary block among the respective auxiliary blocks of the plurality of memory devices 1501, 1502, 1503 and 1504. Which memory device is to be operated among the plurality of memory devices 1501, 1502, 1503 and 1504 is determined according to the operation sequence by the interleaving scheme. While programming the data DATA9, DATA10, DATA11 or DATA12, whose total size is smaller than the predetermined size, in any one auxiliary block among the respective auxiliary blocks of the plurality of memory devices 1501, 1502, 1503 and 1504, the controller 130 does not erase the data DATA9, DATA9+DATA10, DATA9+DATA10+DATA11, or DATA9+DATA10+DATA11+DATA12 from the cache buffer 1441.

In this way, since the data DATA9, DATA9+DATA10, DATA9+DATA10+DATA11, or DATA9+DATA10+DATA11+DATA12 has a smaller size than the predetermined size and is not erased from the cache buffer 1441 even after it is programmed in any one auxiliary block among the respective auxiliary blocks of the plurality of memory devices 1501, 1502, 1503 and 1504, the data DATA9, DATA9+DATA10, DATA9+DATA10+DATA11, or DATA9+DATA10+DATA11+DATA12 is cumulatively buffered in the cache buffer 1441 together with the subsequently inputted data DATA10, DATA11, DATA12 or DATA13. At a time when buffering of the subsequently inputted data DATA10, DATA11, DATA12 or DATA13 is completed, the used area of the cache buffer 1441 is checked again. When the size of the data DATA9, DATA9+DATA10, DATA9+DATA10+DATA11, DATA9+DATA10+DATA11+DATA12 or DATA9+DATA10+DATA11+DATA12+DATA13, which is buffered in the cache buffer 1441, reaches the predetermined size, the data DATA9+DATA10+DATA11+DATA12+DATA13, which is buffered in the cache buffer 1441, is subject to a one-shot program and stored in any one normal block among the respective normal blocks of the plurality of memory devices 1501, 1502, 1503 and 1504.

While one-shot programming the data DATA9+DATA10+DATA11+DATA12+DATA13, which is buffered in the cache buffer 1441 and has the predetermined size, in any one normal block among the respective normal blocks of the plurality of memory devices 1501, 1502, 1503 and 1504, the controller 130 erases the data DATA9+DATA10+DATA11+DATA12+DATA13 from the cache buffer 1441.

Figure 13A:
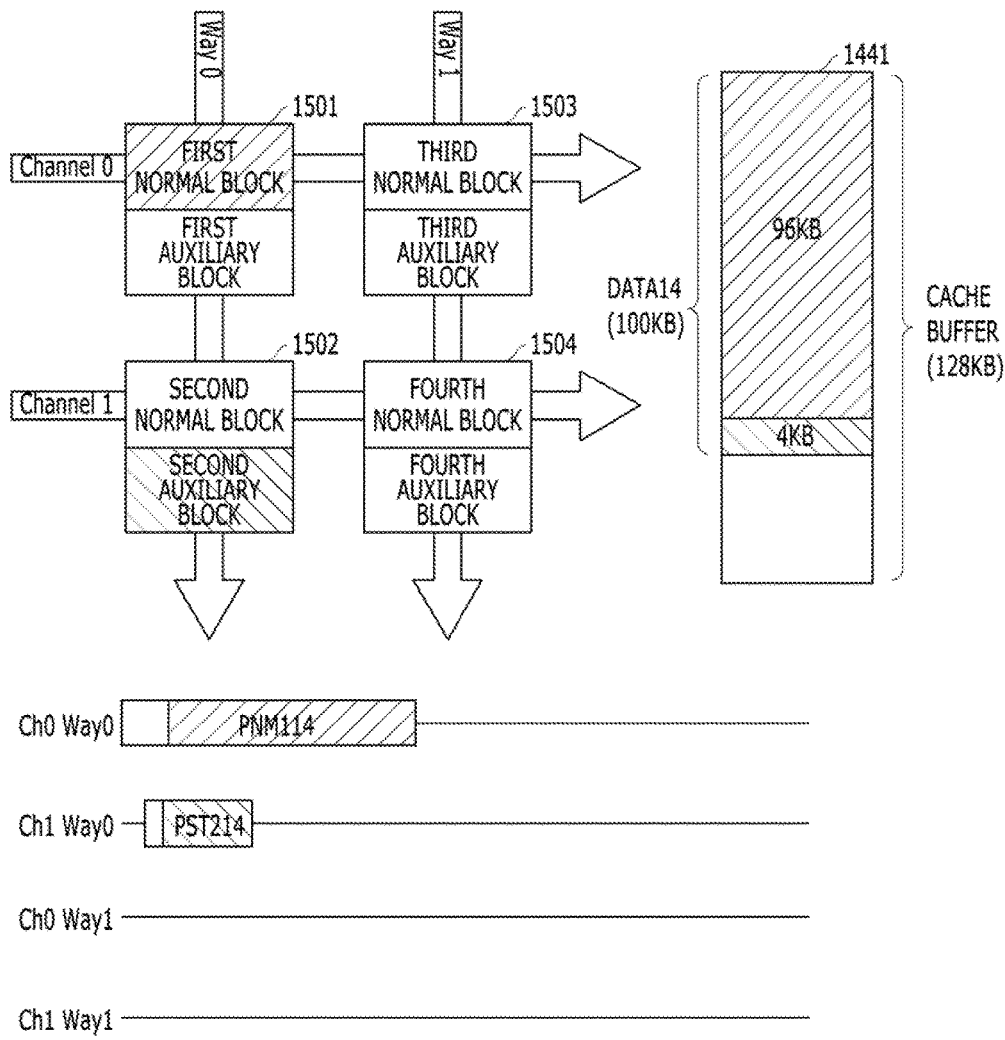
FIGS. 13A and 13B are block diagrams that describe a one-shot program operation of a memory system in accordance with a second embodiment.
Figure 13B:
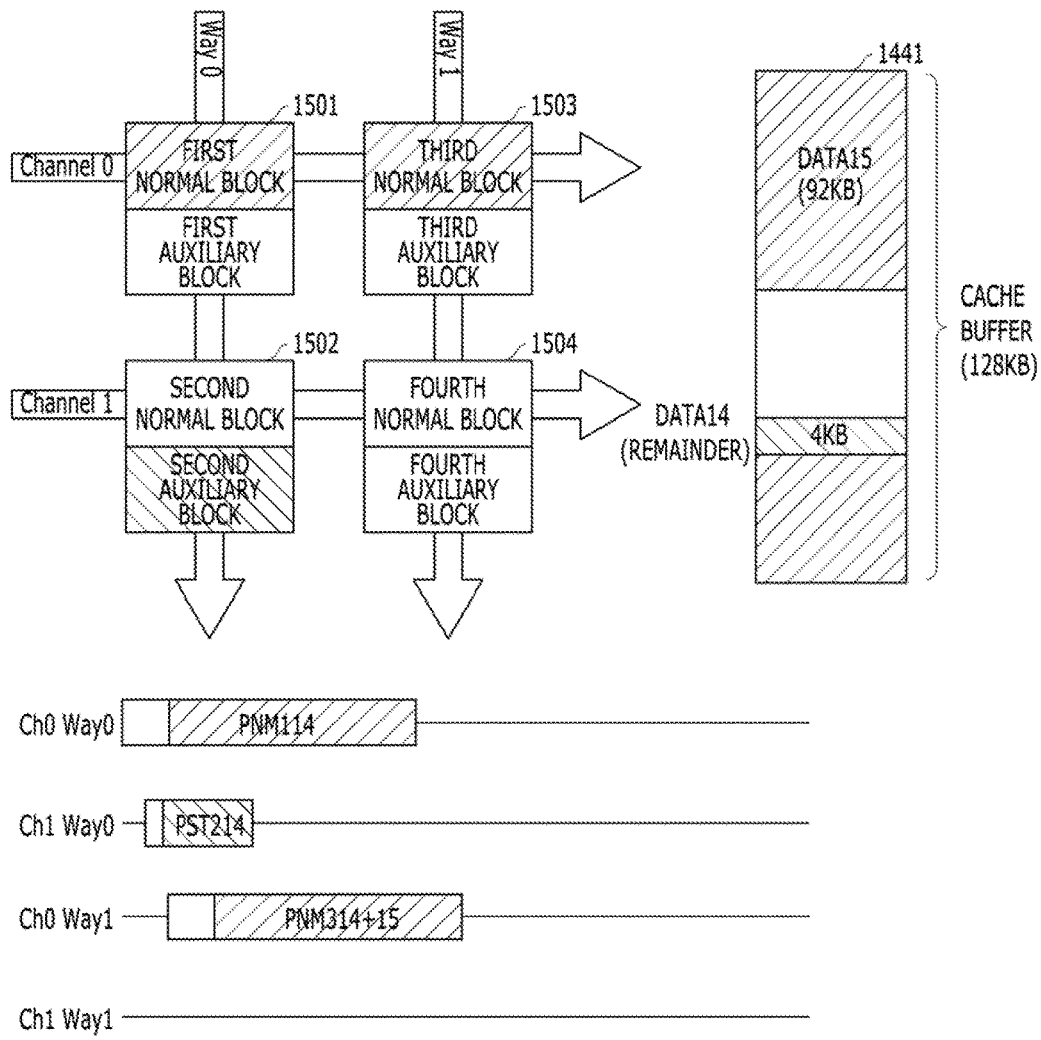

FIGS. 13A and 13B are block diagrams to assist in the explanation of a one-shot program operation of a memory system in accordance with a second embodiment. FIGS. 13A and 13B illustrate how the controller 130 controls the plurality of respective memory devices 1501, 1502, 1503 and 1504 when data larger than the predetermined size, that is, data having a size larger than 96 KB, is inputted from the host. Referring to FIG. 13A, the controller 130 buffers fourteenth data DATA14, which is inputted from the host, in the cache buffer 1441.

The controller 130 checks the used area of the cache buffer 1441, in which the fourteenth data DATA14 is buffered, by taking the predetermined size of 96 KB as a reference. As a result, it may be checked that the fourteenth data DATA14 is buffered in the cache buffer 1441 and the used area of the cache buffer 1441 becomes 100 KB. That is, it may be checked that the used area of the cache buffer 1441, in which the fourteenth data DATA14 is buffered, is 100 KB and larger than 96 KB which is used as the predetermined size.

Accordingly, the controller 130 one-shot programs, as indicated by the reference symbol PNM14, (i) part of the fourteenth data DATA14, whose size is 96 KB, in any one normal block of the respective normal blocks of the plurality of memory devices 1501, 1502, 1503 and 1504, and programs, as indicated by the reference symbol PST214, (ii) the data of remaining 4 KB in any one auxiliary block among the respective auxiliary blocks of the plurality of memory devices 1501, 1502, 1503 and 1504. Since the fourteenth data DATA14 has a size larger than the predetermined size, the controller 130 divides the fourteenth data DATA14 into first portion data of the predetermined size and the remaining data, one-shot programs the first portion data in any one among the respective normal blocks of the plurality of memory devices 1501, 1502, 1503 and 1504, and programs the remaining data in any one of the respective auxiliary blocks of the plurality of memory devices 1501, 1502, 1503 and 1504.

For example, according to the operation sequence by the interleaving scheme, the controller 130 programs, as indicated by the reference symbol PNM114, the first portion data of the predetermined size in the fourteenth data DATA14, in the first normal block of the first memory device 1501 among the plurality of memory devices 1501, 1502, 1503 and 1504, and programs, as indicated by the reference symbol PST214, the remaining data in the second auxiliary block of the second memory device 1502 among the plurality of memory devices 1501, 1502, 1503 and 1504.

The controller 130 programs, as indicated by the reference symbol PST214, the remaining data of the fourteenth data DATA14 in an empty space of the second auxiliary block included in the second memory device 1502 which is designated by the second storage location information (not shown) stored in the address management region. Then, the controller 130 updates the second storage location information and stores the updated second storage location information in the address management region.

The updated second storage location information stored in the address management region in this way is stored in a normal block of any one memory device according to the operation sequence by the interleaving scheme and selected among the first, third and fourth memory devices 1501, 1503 and 1504 excluding the second memory device 1502. For example, in an embodiment, the operation of one-shot programming the data of the cache buffer 1441 in the third normal block of the third memory device 1503 is performed following the operation of programming the second auxiliary block of the second memory device 1502. The second storage location information is stored together in the third normal block when one-shot programming data of the cache buffer 1441 in the third normal block of the third memory device 1503. The second storage location information may be stored in the third normal block together with data of the cache buffer 1441 in this way since the second storage location information is stored in a spare region of the third normal block.

While performing the one-shot program PNM114 for the first memory device 1501, the controller 130 erases the data, which has the predetermined size, from the cache buffer 1441. Conversely, when performing the program designated by the reference symbol PST214 for the second memory device 1502, the controller 130 does not erase the remaining data except the data of the predetermined size from the cache buffer 1441. That is, the controller 130 erases the first portion data of 96 KB which was one-shot programmed, as indicated by the reference symbol PNM114, in the first memory device 1501, but does not erase the remaining data of 4 KB from the cache buffer 1441. The remaining data of 4 KB was programmed, as indicated by the reference symbol PST214, in the second memory device 1502.

In this way, the remaining data of the fourteenth data DATA14 which is buffered in the cache buffer 1441 is programmed in the second auxiliary block of the second memory device 1502 while not being erased from the cache buffer 1441. In this case, data iteratively stored in any one among the respective auxiliary blocks of the plurality of memory devices 1501, 1502, 1503 and 1504 and in the cache buffer 1441 is managed as a valid state in any one among the respective auxiliary blocks of the plurality of memory devices 1501, 1502, 1503 and 1504.

Referring to FIG. 13B, the controller 130 buffers fifteenth data DATA15, which is inputted from the host, in the cache buffer 1441. The controller 130 checks the used area of the cache buffer 1441, in which the fifteenth data DATA15 is buffered, by taking the predetermined size of 96 KB as a reference. As a result, it may be checked that the total size of the remaining data of the fourteenth data DATA14 and the fifteenth data DATA15, which are cumulatively buffered in the cache buffer 1441, used area occupying the cache buffer 1441 is 96 KB.

The controller 130 does not erase the remaining data of the fourteenth data DATA14 from the cache buffer 1441 as described above with reference to FIG. 13A, and cumulatively buffers the subsequently inputted fifteenth data DATA15 together with the unerased remaining data of the fourteenth data DATA14 in the cache buffer 1441. Thus, the total used area of the cache buffer 1441, in which the remaining data of the fourteenth data DATA14 and the fifteenth data DATA15 are cumulatively buffered, becomes 96 KB.

Accordingly, the controller 130 may one-shot program the data, which is obtained by cumulatively adding the remaining data of the fourteenth data DATA14 and the fifteenth data DATA15, in any one normal block among the respective normal blocks of the plurality of memory devices 1501, 1502, 1503 and 1504.

The fifteenth data DATA15 is buffered in the cache buffer 1441 when the operation of one-shot programming the first portion data of the predetermined size in the fourteenth data DATA14 in the first normal block of the first memory device 1501 is being performed and the operation of programming the remaining data of the fourteenth data DATA14 in the second auxiliary block of the second memory device 1502 is being performed, as described above with reference to FIG. 13A. That is, the fifteenth data DATA15 is buffered in the cache buffer 1441 when the third memory device 1503 and the fourth memory device 1504 among the plurality of memory devices 1501, 1502, 1503 and 1504 do not perform any operations.

Therefore, according to the operation sequence by the interleaving scheme, the third memory device 1503 operates among the plurality of memory devices 1501, 1502, 1503 and 1504 when the controller 130 one-shot programs, as indicated by the reference symbol PNM314+15, the data, which is obtained by cumulatively adding the remaining data of the fourteenth data DATA14 and the fifteenth data DATA15 buffered in the cache buffer 1441, in the third normal block of the third memory device 1503. Of course, the present invention is not limited to one-shot programming of the data, which is obtained by cumulatively adding the remaining data of the fourteenth data DATA14 and the fifteenth data DATA15 buffered in the cache buffer 1441, in the third normal block of the third memory device 1503. In another embodiment, any different operation is available according to a designer's choice.

While performing the one-shot program PNM314+15 in the third memory device 1503, the controller 130 erases the data obtained by cumulatively adding the remaining data of the fourteenth data DATA14 and the fifteenth data DATA15 from the cache buffer 1441.

In this way, the remaining data of the fourteenth data DATA14, which has been buffered in the cache buffer 1441 while having been programmed in the second auxiliary block of the second memory device 1502, is erased from the cache buffer 1441 as the remaining data of the fourteenth data DATA14 and the fifteenth data DATA15 are programmed together in the third normal block of the third memory device 1503. That is, data is erased from the cache buffer 1441 (i) when the data is programmed in any one normal block among the respective normal blocks of the plurality of memory devices 1501, 1502, 1503 and 1504, (ii) after the data is programmed in any one among the respective auxiliary blocks of the plurality of memory devices 1501, 1502, 1503 and 1504. The data, which is iteratively programmed in any one auxiliary block and any one normal block among the respective auxiliary blocks and the respective normal blocks of the plurality of memory devices 1501, 1502, 1503 and 1504, is managed as an invalid state in any one auxiliary block among the respective auxiliary blocks of the plurality of memory devices 1501, 1502, 1503 and 1504.

In summary, the controller 130 operates the plurality of memory devices 1501, 1502, 1503 and 1504 in the interleaving scheme. Also, the controller 130 checks the used area of the cache buffer 1441 at each time of buffering each of the plurality of data DATA<14:15>, which is inputted sequentially, in the cache buffer 1441. When the used area of the cache buffer 1441 is larger than the predetermined size, the controller 130 divides the data DATA14, which is buffered in the cache buffer 1441 and is larger than the predetermined size, into multiple data fragments, for example, first portion data having a predetermined size and the remaining data. Then, the controller 130 one-shot programs the first portion data having the predetermined size in any one among the respective normal blocks of the plurality of memory devices 1501, 1502, 1503 and 1504. The controller 130 programs the remaining data in any one among the respective auxiliary blocks of the plurality of memory devices 1501, 1502, 1503 and 1504. Which memory device is to be operated among the plurality of memory devices 1501, 1502, 1503 and 1504 is determined according to the operation sequence by the Interleaving scheme.

While one-shot programming the first portion data of the data DATA14 in any one among the respective normal blocks of the plurality of memory devices 1501, 1502, 1503 and 1504, the controller 130 erases the first portion data of the data DATA14 from the cache buffer 1441. While programming the remaining data of the data DATA14 in any one among the respective auxiliary blocks of the plurality of memory devices 1501, 1502, 1503 and 1504, the controller 130 does not erase the remaining data of the data DATA14 from the cache buffer 1441.

Since the remaining data of the data DATA14 is not erased from the cache buffer 1441 even after it is programmed in any one auxiliary block among the respective auxiliary blocks of the plurality of memory devices 1501, 1502, 1503 and 1504, the remaining data of the data DATA14 is cumulatively buffered in the cache buffer 1441 together with subsequently inputted data DATA15. Thus, when buffering of the subsequently inputted data DATA15 is completed, the used area of the cache buffer 1441 is checked again. When the total size of the data DATA14(REMAINDER)+DATA15, which are buffered in the cache buffer 1441, reaches the predetermined size, the data DATA14(REMAINDER)+DATA15, which is buffered in the cache buffer 1441 and has the predetermined size, is one-shot programmed in any one normal block among the respective normal blocks of the plurality of memory devices 1501, 1502, 1503 and 1504.

While one-shot programming the data DATA14(REMAINDER)+DATA15, which is buffered in the cache buffer 1441 and has the predetermined size, in any one normal block among the respective normal blocks of the plurality of memory devices 1501, 1502, 1503 and 1504, the controller 130 erases the data DATA14(REMAINDER)+DATA15 from the cache buffer 1441e.

The respective auxiliary blocks, that is, the first to fourth auxiliary blocks, of the plurality of memory devices 1501, 1502, 1503 and 1504 may be checked used area based on the first to fourth storage location information. Accordingly, the controller 130 may check the used areas of the respective auxiliary blocks of the plurality of memory devices 1501, 1502, 1503 and 1504 based on the first to fourth storage location information, and may then erase an auxiliary block which exceeds a predetermined usable size. Of course, when an auxiliary block is to be erased, all data stored therein should be in an invalid state.

Figure 14:
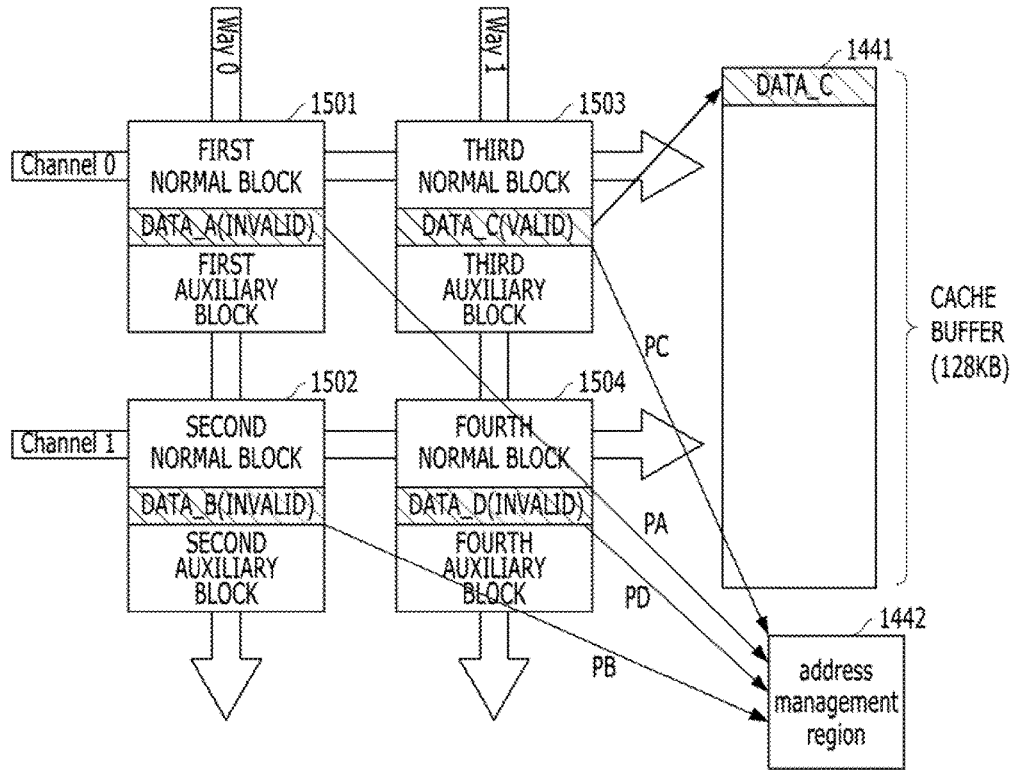
FIG. 14 is a block diagram that describes a booting operation of the memory systems in accordance with the first and second embodiments.

FIG. 14 is a block diagram that describes a booting operation of the memory systems in accordance with the first and second embodiments. FIG. 14 illustrates how data which is programmed in the respective auxiliary blocks of the plurality of memory devices 1501, 1502, 1503 and 1504 is recovered when the memory system newly starts a booting operation, for example, in a power supply interruption.

Data stored in the respective auxiliary blocks of the plurality of memory devices 1501, 1502, 1503 and 1504 includes data in an invalid state and data in a valid state. The data in the invalid state among the data stored in the respective auxiliary blocks of the plurality of memory devices 1501, 1502, 1503 and 1504 means data which is (i) programmed in any one of the respective auxiliary blocks of the plurality of memory devices 1501, 1502, 1503 and 1504, (ii) is erased from the cache buffer 1441 as it is programmed in any one of the respective normal blocks of the plurality of memory devices 1501, 1502, 1503 and 1504, and (iii) is thereby iteratively programmed in any one auxiliary block and any one normal block among the respective auxiliary blocks and the respective normal blocks of the plurality of memory devices 1501, 1502, 1503 and 1504. Furthermore, the data in the invalid state is data which is already erased from the cache buffer 1441 before the booting operation.

Therefore, it is not necessary for the data in the invalid state to be recovered to the cache buffer 1441 during the booting operation. For example, as shown in the drawings, all of data DATA_A, DATA_B and DATA_D stored in the first auxiliary block of the first memory device 1501, the second auxiliary block of the second memory device 1502 and the fourth auxiliary block of the fourth memory device 1504 are in the invalid state. Thus, they do not need to be buffered again in the cache buffer 1441.

Conversely, data in a valid state among the data stored in the respective auxiliary blocks of the plurality of memory devices 1501, 1502, 1503 and 1504 is data which is iteratively stored in any one among the respective auxiliary blocks of the plurality of memory devices 1501, 1502, 1503 and 1504 and the cache buffer 1441 before the booting operation. Therefore, it is necessary for the data in the valid state to be recovered to the cache buffer 1441 during the booting operation. For example, as shown in the drawings, data DATA_C stored in the third auxiliary block of the third memory device 1503 is in the valid state, and the data DATA_C is buffered again in the cache buffer 1441.

Storage location information, which designates locations of empty spaces in the respective auxiliary blocks of the plurality of memory devices 1501, 1502, 1503 and 1504, is read from the respective normal blocks of the plurality of memory devices 1501, 1502, 1503 and 1504 and is stored in an address management region 1442. A first storage location information PA, which designates a location of an empty space in the first auxiliary block of the first memory device 1501, is stored in the normal block included in any one memory device among the second to fourth memory devices 1502, 1503 and 1504 excluding the first memory device 1501.

A second storage location information PB, which designates a location of an empty space in the second auxiliary block of the second memory device 1502, is stored in the normal block included in any one memory device among the first, third and fourth memory devices 1501, 1503 and 1504 excluding the second memory device 1502.

A third storage location information PC, which designates a location of an empty space in the third auxiliary block of the third memory device 1503, is stored in the normal block included in any one memory device among the first, second and fourth memory devices 1501, 1502 and 1504 excluding the third memory device 1503.

A fourth storage location information PD, which designates a location of an empty space in the fourth auxiliary block of the fourth memory device 1504, is stored in the normal block included in any one memory device among the first to third memory devices 1501, 1502 and 1503 excluding the fourth memory device 1504.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
    a first memory device including a first normal block and a first auxiliary block;
    a second memory device including a second normal block and a second auxiliary block; and
    a controller configured to operate the first and second memory devices in an interleaving scheme,
    wherein the controller:
    checks a first used area of a cache buffer when data is buffered which is the most recently inputted,
    programs a first data in the first or second auxiliary block without erasing the first data from the cache buffer, when the first used area of the cache buffer is smaller than a predetermined size,
    programs a second data of the predetermined size, which occupies a part of the first used area of the cache buffer, to the first or second normal block with erasing the second data from the cache buffer, when the first used area of the cache buffer is equal to or larger than the predetermined size, and
    wherein the controller stores a mapping information on a physical address and a logical address of the second data and a physical address of the first data in an address management region, and does not store a logical address of the first data in the address management region.

2. The memory system according to claim 1, wherein in case of the first data is inputted when a third data which is inputted prior to the first data remains in the cache buffer, the controller further buffers the first data in the cache buffer together with the third data.

3. The memory system according to claim 1, wherein the controller programs a physical address designating a location from which an empty space of the first auxiliary block starts, in the address management region, as a first storage location information, and programs a physical address designating a location from which an empty space of the second auxiliary block starts, in the address management region, as a second storage location information.

4. The memory system according to claim 3, wherein the controller programs the first data in the first auxiliary block or the second data in the first normal block when the first memory device operates in the interleaving scheme, and programs the first data in the second auxiliary block or the second data in the second normal block when the second memory device operates in the interleaving scheme.

5. The memory system according to claim 4, wherein the controller programs the second data with the second storage location information in the first normal block when the first memory device operates in the interleaving scheme, and programs the second data with the first storage location information in the second normal block when the second memory device operates in the interleaving scheme.

6. The memory system according to claim 5, wherein, in case where the first data is programmed in the first auxiliary block when the first memory device operates in the interleaving scheme, the controller programs the first data in the empty space of the first auxiliary block using the first storage location information and then updates the first storage location information, and wherein, in case where the first data is programmed in the second auxiliary block when the second memory device operates in the interleaving scheme, the controller programs the first data in the empty space of the second auxiliary block using the second storage location information and then updates the second storage location information.

7. The memory system according to claim 2, wherein, when a size of the first data and the third data is equal to or larger than the predetermined size, the controller programs the first data and the third data as the second data in the first or second normal block.

8. The memory system according to claim 7, wherein the controller manages the first data as a valid state in the first or the second auxiliary block when the first data is stored both in any of the first and the second auxiliary blocks and in the cache buffer, and manages the first data as an invalid state in the first or the second auxiliary block when the first data is stored both in any of the first and the second auxiliary blocks and in any of the first and the second normal blocks.

9. The memory system according to claim 8, wherein, during a booting operation period, the controller buffers the first data of the valid state stored in the first and the second auxiliary blocks, in the cache buffer, reads the second storage location information stored in the first normal block and the first storage location information stored in the second normal block, and stores the first and the second storage location information in the address management region.

10. The memory system according to claim 3, wherein the controller checks a second used area of the first or second auxiliary block using the first or second storage location information, and erases the first or second auxiliary block, when the second used area exceeds a predetermined usable size.

11. A method for operating a memory system having a first memory device and a second memory device, the first memory device including a first normal block and a first auxiliary block, the second memory device including a second normal block and a second auxiliary block, the method comprising:

operating the first memory device and the second memory device in an interleaving scheme;

checking a first used area of a cache buffer when buffering of a first data which is the most recently inputted;

programming a first data in the first or second auxiliary block without erasing the data from the cache buffer, when the first used area of the cache buffer is smaller than a predetermined size;

programming a second data of the predetermined size, which occupies a part of the first used area of the cache buffer, to the first or second normal block with erasing the second data from the cache buffer, when the first used area of the cache buffer is equal to or larger than the predetermined size;

storing a mapping information on a physical address and a logical address of the second data and a physical address of the first data in an address management region; and not storing a logical address of the first data in the address management region.

12. The method according to claim 11, wherein, in case of the first data is inputted when a third data which is inputted prior to the first data remains in the cache buffer, the buffering of the first data comprises buffering the third data together with the first data in the cache buffer.

13. The method according to claim 11, further comprising:

storing a physical address designating a location from which an empty space of the first auxiliary block starts, in the address management region, as a first storage location information; and storing a physical address designating a location from which an empty space of the second auxiliary block starts, in the address management region, as a second storage location information.

14. The method according to claim 13, wherein the erasing the second data from the cache buffer, when the first used area of the cache buffer is equal to or larger than the predetermined size comprises:

selecting the first memory device or the second memory device according to the interleaving scheme;

when the first memory device is selected, programming the second data with the second storage location information in the first normal block and erasing the second data from the cache buffer; and when the second memory device is selected, programming the second data with the first storage location information in the second normal block and erasing the second data from the cache buffer.

15. The method according to claim 14, wherein the without erasing the first data from the cache buffer, when the first used area of the cache buffer is smaller than a predetermined size comprises:

selecting the first memory device or the second memory device according to the interleaving scheme;

when the first memory device is selected, programming the first data in the empty space of the first auxiliary block using the first storage location information, updating the first storage location information, and without erasing the first data from the cache buffer; and when the second memory device is selected, programming the first data in the empty space of the second auxiliary block using the second storage location information, updating the second storage location information, and without erasing the first data from the cache buffer.

16. The method according to claim 12, wherein, when a size of the first data and the third data is equal to or larger than the predetermined size, the programming of the second data of the predetermined size comprises programing the first data and the third data as the second data in the first or second normal block.

17. The method according to claim 16, further comprising:
managing the first data as a valid state in the first or the second auxiliary block, when the first data which is stored both in any of the first and the second auxiliary blocks and in the cache buffer; and
managing the first data as an invalid state in the first or the second auxiliary block, when the first data is stored both in any of the first and the second auxiliary blocks and in any of the first and the second normal blocks.

18. The method according to claim 17, further comprising:
during a booting operation period, buffering the first data of the valid state stored in the first and the second auxiliary block, in the cache buffer;
during the booting operation period, reading the second storage location information stored in the first normal block and the first storage location information stored in the second normal block; and
during the booting operation period, storing the first and the second storage location information in the address management region.

* * * * *